US007723996B2

(12) United States Patent
Lee et al.

(10) Patent No.: US 7,723,996 B2
(45) Date of Patent: May 25, 2010

(54) INVERTER CIRCUIT AND BACKLIGHT ASSEMBLY HAVING THE SAME

(75) Inventors: Yun-Gun Lee, Cheonan-si (KR); Jin-Won Jang, Asan-si (KR); Tatsuhisa Shimura, Tokyo (JP); Osamu Sengoku, Tokyo (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 312 days.

(21) Appl. No.: 11/864,616

(22) Filed: Sep. 28, 2007

(65) Prior Publication Data

US 2008/0079440 A1 Apr. 3, 2008

(30) Foreign Application Priority Data

Sep. 28, 2006 (KR) ..................... 10-2006-0094924

(51) Int. Cl.
*G01R 31/02* (2006.01)

(52) U.S. Cl. .......................... 324/537; 324/510; 363/95

(58) Field of Classification Search ................. 324/537, 324/510, 76.11; 363/55, 95
See application file for complete search history.

(56) References Cited

U.S. PATENT DOCUMENTS

| | | | | |
|---|---|---|---|---|
| 6,724,313 | B2 * | 4/2004 | Sato et al. | 340/590 |
| 7,154,277 | B2 * | 12/2006 | Vallinmaki et al. | 324/509 |
| 2006/0284568 | A1 * | 12/2006 | Chang et al. | 315/282 |

FOREIGN PATENT DOCUMENTS

| | | |
|---|---|---|
| JP | 2005-142099 | 6/2005 |
| JP | 2005-267923 | 9/2005 |
| KR | 1020050082708 | 8/2005 |

* cited by examiner

*Primary Examiner*—Vincent Q Nguyen
(74) *Attorney, Agent, or Firm*—Innovation Counsel LLP

(57) ABSTRACT

An inverter circuit includes plural pairs of third coils, in which adjacent third coils are serially connected to each other so as to offset AC voltage generated from the paired third coils, one end of the paired third coils being connected to ground. Input terminals of plural diodes are connected to one end of the paired third coils so as to generate the voltage detection value by detecting voltage generated from the paired third coils. A fault detector compares the voltage detection value generated from the diodes with a predetermined threshold value to detect a fault and generates the comparison result.

20 Claims, 20 Drawing Sheets

INVERTER CIRCUIT AND BACKLIGHT ASSEMBLY HAVING THE SAME

CROSS-REFERENCE TO RELATED APPLICATION

This application relies for priority upon Korean Patent Application No. 2006-94924 filed on Sep. 28, 2006, the disclosure of which is incorporated herein by reference.

BACKGROUND

1. Field of Invention

The present invention relates to liquid crystal displays and, more particularly, to a backlight assembly having an inverter for powering a plurality of discharge tubes, such as cold cathode fluorescent lamps, as a light source for the display.

2. Description of the Related Art

Conventional liquid crystal displays (LCDs) are made to be light-weight, compact and have low power consumption. Since the LCD is a non-emissive device, a light source such as cold cathode fluorescent lamp is used. The cold cathode fluorescent lamp is a kind of a fluorescent lamp that operates in the regular glow discharge region using an applied AC voltage. Since the cold cathode fluorescent lamp is not preheated by a filament, it is relatively more vibration resistant, has a thinner diameter and a longer life span compared to a hot cathode fluorescent lamp but requires a higher voltage to be applied, for which an inverter circuit is used.

As shown in FIG. 18, the conventional inverter circuit includes first and second inverters 11 and 12, a plurality of balance transformers 13, and a plurality of diodes 14.

Primary coils 13*a* of the balance transformers 13 are connected to output terminals of the first and second inverters 11 and 12. The first and second inverters 11 and 12 convert DC voltage into AC voltage and supply the AC voltage to two pairs of cold cathode fluorescent lamps 20 through the primary coils 13*a* of the balance transformers 13.

Among the secondary coils 13*b* of the balance transformers 13, adjacent secondary coils 13*b* are serially connected to each other to form a secondary coil serial loop, one end of the secondary coil serial loop being connected to the ground GND.

First ends of third coils 13*c* of the balance transformers 13 are connected to the ground GND through the secondary coil serial loop and second ends of the third coils 13*c* of the balance transformers 13 are connected to input terminals of the diodes 14.

Input terminals of the diodes 14 are connected to the first ends of the third coils 13*c*. The diodes 14 detect voltage generated from the third coils 13*c* and then generate voltage detection values.

Japanese Patent Unexamined Publication No. 2005-267923 discloses an error detection circuit employed in a discharge tube control circuit that controls the turn on/off of the first and second discharge tubes. An error signal generating device generates an error signal when the current balance of the first and second discharge tubes is different from the reference current balance.

However, as shown in FIG. 19, since the cold cathode fluorescent lamps are aligned between a diffusion plate and a reflective plate, when the cold cathode fluorescent lamps are turned on, heat is transferred upward by convection along the cold cathode fluorescent lamps causing the internal temperature of the backlight assembly to rise and lowering the lamps' impedance. FIG. 20 shows that, as the cold cathode fluorescent lamps generate heat, an impedance gradient occurs in the backlight assembly caused by the temperature gradient.

The conventional inverter circuit includes a circuit that detects voltage at the diodes connected to the third coils when the impedance changes due to the temperature gradient. The voltage value due to the impedance change must be taken into consideration when setting the threshold value used to detect the normal operation and abnormal operation. As a result, the conventional inverter circuit has a higher threshold value because of the increase of the voltage value caused by the impedance change according to the temperature gradient. For this reason, when the voltage is slightly increased due to arc discharge caused by an opening fault, the voltage level may not reach the threshold value, so that the voltage variation with temperature cannot be precisely detected.

SUMMARY

According to one aspect of the present invention, an inverter circuit precisely detects abnormal operation when the threshold voltage is increased due to the impedance change caused by the temperature gradient.

The present invention also provides a backlight assembly having the inverter circuit.

In one illustrative embodiment, an inverter circuit includes a plurality of balance transformers and a fault detection device that detects a fault based on the values of current applied to the balance transformers. The balance transformers include plural pairs of primary coils connected between the output terminals of inverters and plural pairs of discharge tubes and a plurality of secondary coils aligned corresponding to the primary coils, in which adjacent secondary coils are serially connected to each other to form a serial loop of the secondary coils, a part of the serial loop of the secondary coils being connected to ground. The fault detection device includes plural pairs of third coils aligned corresponding to the primary coils, in which adjacent third coils, which are aligned as a pair, are serially connected to each other to offset AC voltage generated from the paired third coils, one end of the paired third coils being connected to ground, a plurality of diodes having input terminals connected to the other end of the paired third coils so as to generate a voltage detection value by detecting voltage generated from the paired third coils, and a fault detector comparing the voltage detection value generated from output terminals of the diodes with a predetermined threshold value to detect a fault and generating the comparison result.

BRIEF DESCRIPTION OF THE DRAWINGS

The above and other advantages of the present invention will become readily apparent by reference to the following detailed description when considered in conjunction with the accompanying drawings, in which.

DETAILED DESCRIPTION

Hereinafter, exemplary embodiments of the present invention will be described in detail with reference to accompanying drawings. However, the scope of the present invention is not limited to such embodiments and the present invention may be realized in various forms.

Embodiment 1

Figure 1:
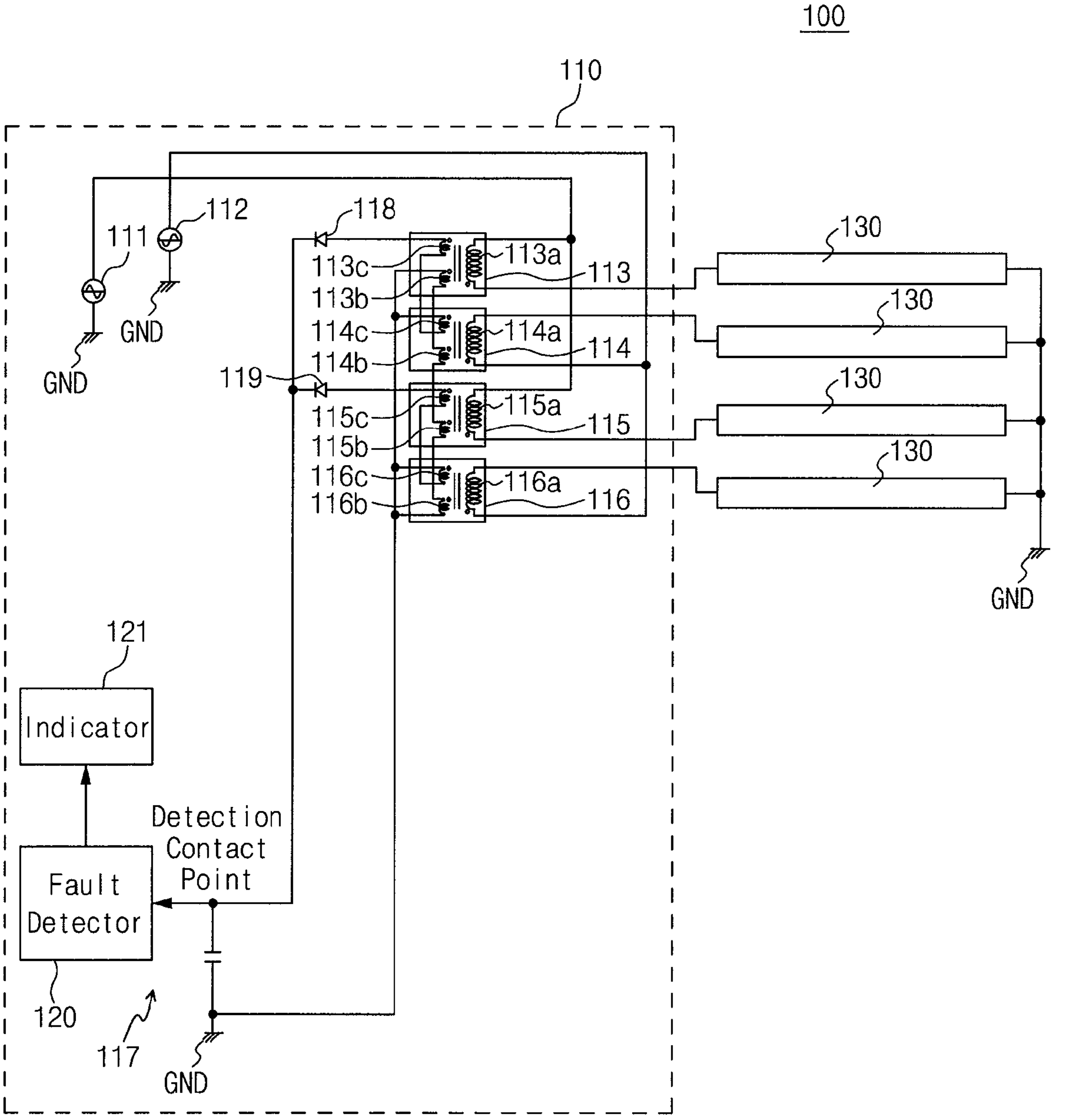
FIG. 1 is a circuit diagram showing an inverter circuit and a backlight assembly according to a first embodiment of the present invention.

FIG. 1 is a circuit diagram showing an inverter circuit and a backlight assembly according to a first embodiment of the present invention.

As shown in FIG. 1, the backlight assembly 100 includes the inverter circuit 110 and two pairs of cold cathode fluorescent lamps (discharge tubes) 130.

The inverter circuit 110 includes two inverters 111 and 112, four balance transformers 113 to 116, and a fault detection device 117.

The inverter 111 converts DC voltage into AC voltage so as to apply the AC voltage (hereinafter, referred to as positive AC voltage for the purpose of discrimination relative to AC voltage to be described below) to the two pairs of the cold cathode fluorescent lamps 130 through primary coils 113*a* and 115*a* of the balance transformers 113 and 115. The inverter 112 converts DC voltage into AC voltage so as to apply the AC voltage (hereinafter, referred to as negative AC voltage) having the same amplitude but opposite phase to the two pairs of the cold cathode fluorescent lamps 130 through primary coils 114*a* and 116*a* of the balance transformers 114 and 116.

The balance transformer 113 has the primary coil 113*a* connected between an output terminal of the inverter 111 and the cold cathode fluorescent lamp 130. The balance transformer 114 has the primary coil 114*a* connected between an output terminal of the inverter 112 and the cold cathode fluorescent lamp 130. The balance transformer 115 has the primary coil 115*a* connected between the output terminal of the inverter 111 and the cold cathode fluorescent lamp 130. The balance transformer 116 has the primary coil 116*a* connected between the output terminal of the inverter 112 and the cold cathode fluorescent lamp 130.

AC voltage is induced in the secondary coils 113*b* and 114*b* and third coils 113*c* and 114*c* by the AC voltage applied to the primary coils 113*a* and 114*a*. In addition, AC voltage is induced into the secondary coils 115*b* and 116*b* and third coils 115*c* and 116*c* by the AC voltage applied to the primary coils 115*a* and 116*a*.

Other ends of the two pairs of the cold cathode fluorescent lamps 130 are connected to ground GND. The cold cathode fluorescent lamps 130 are driven by high voltage that causes high electrostatic noise to be generated by the cold cathode fluorescent lamps 130. To reduce the effect of this high electrostatic noise, voltages that have a phase difference of 180° are preferably applied to the cold cathode fluorescent lamps 130. According to the first embodiment as shown in FIG. 1, positive and negative high AC voltages, which are phase-shifted from each other by 180°, are applied to adjacent cold cathode fluorescent lamps 130, so that electrostatic noise generated from the cold cathode fluorescent lamps 130 is offset.

Among the secondary coils 113*b*, 114*b*, 115*b* and 116*b* of four balance transformers 113, 114, 115 and 116, adjacent secondary coils are serially connected to each other to form a serial loop, a part of the secondary coil serial loop being connected to the ground GND. The secondary coils 113*b*, 114*b*, 115*b* and 116*b* of four balance transformers 113, 114, 115 and 116 generate voltage detection values of the AC voltage induced by the primary coils 113*a*, 114*a*, 115*a*, and 116*a* and transmit the voltage detection values to a fault detector 120.

The fault detection device 117 detects high voltage abnormal discharge in the inverter circuit 110, such as corona discharge and arc discharge, which are generated when a defect occurs in an insulator provided between a high voltage section and ground GND. The fault detection device 117 detects the abnormal operation based on the voltage detection values generated from voltages of the balance transformers 113, 114, 115 and 116.

The fault detection device 117 includes two pairs of third coils 113*c*, 114*c*, 115*c* and 116*c* added to four balance transformers 113, 114, 115 and 116, two diodes 118 and 119, the fault detector 120 and an indicator 121.

Among the third coils 113*c*, 114*c*, 115*c* and 116*c*, adjacent third coils, which are aligned as a pair, are serially connected to each other so as to offset AC voltage generated from the paired third coils, one end of the paired third coils being connected to the secondary coil serial loop. In addition, one end of the paired third coils can be directly connected to the ground GND, other than connected to the ground GND through the secondary coil serial loop.

That is, the paired third coils 113c and 114c are serially connected to each other so as to offset AC voltage generated from the paired third coils 113c and 114c, one end of the paired third coils 113c and 114c is connected to the ground GND by way of the serial loop of the secondary coils 113b, 114b, 115b and 116b.

In addition, the paired third coils 115c and 116c are serially connected to each other so as to offset AC voltage generated from the paired third coils 115c and 116c, one end of the paired third coils 115c and 116c is connected to the ground GND by way of the serial loop of the secondary coils 113b, 114b, 115b and 116b.

Input terminals of the diodes 118 and 119 are connected to the paired third coils so as to detect ripple voltage generated from the paired third coils and then produce the voltage detection value.

That is, the input terminal of the diode 118 is connected to the paired third coils 113c and 114c adjacent to each other in order to produce the voltage detection value by detecting the ripple voltage generated from the paired third coils 113c and 114c.

In addition, the input terminal of the diode 119 is connected to the paired third coils 115c and 116c in order to produce the voltage detection value by detecting the ripple voltage generated from the paired third coils 115c and 116c.

The fault detector 120 is connected to output terminals of the diodes 118 and 119. The fault detector 120 compares the voltage detection value generated from voltage of the diodes 118 and 119 with the predetermined threshold value so as to detect the fault and generates the comparison result.

The indicator 121, for instance, displays the comparison result on a display device (not shown).

Figure 2:
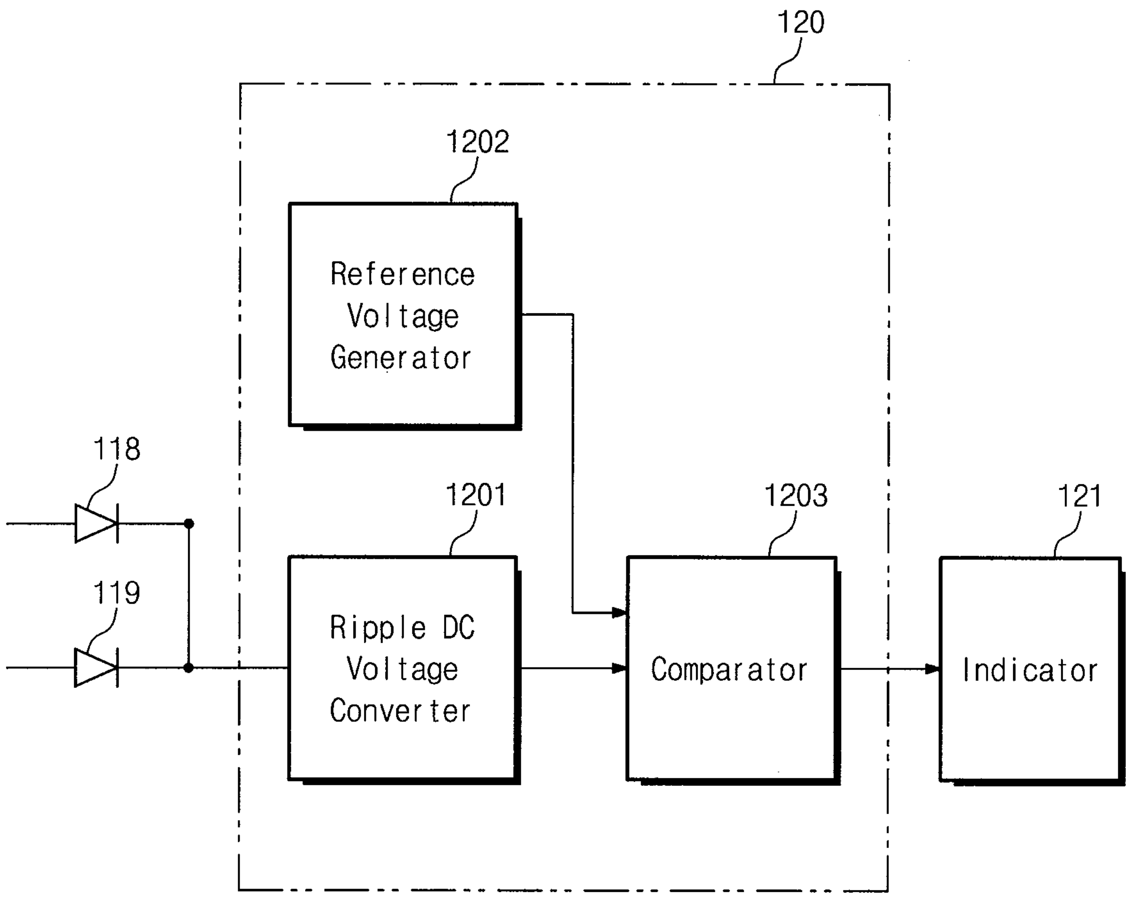
FIG. 2 is a block diagram showing the structure of an inverter and a fault detection unit of a backlight assembly according to a first embodiment of the present invention.

Hereinafter, an example of the fault detector 120 will be described with reference to FIG. 2. FIG. 2 is a block diagram showing an example of the fault detector 120.

As shown in FIG. 2, the fault detector 120 includes a ripple DC voltage converter 1201, a reference voltage generator 1202, and a comparator 1203.

An input terminal of the ripple DC voltage converter 1201 is connected to the output terminals of the diodes 118 and 119. An output terminal of the ripple DC voltage converter 1201 is connected to one input terminal of the comparator 1203. An output terminal of the reference voltage generator 1202 is connected to the other input terminal of the comparator 1203. An output terminal of the comparator 1203 is connected to an input terminal of the indicator 121.

The ripple DC voltage converter 1201 converts ripple voltage detected from the diodes 118 and 119 into DC voltage through filtering or peak hold scheme and sends a voltage detection value to the comparator 1203. The reference voltage generator 1202 generates reference voltage and sends the reference voltage to the comparator 1203. The comparator 1203 compares the voltage detection value output from the ripple DC voltage converter 1201 with the reference voltage value output from the reference voltage generator 1202, and sends the comparison result to the indicator 121. The indicator 121 displays the comparison result obtained from the comparator 1203.

According to the first embodiment of the present invention, the adjacent third coils, which are aligned as a pair, are serially connected to each other so that the AC voltages generated from the paired third coils are offset. In addition, one end of the paired third coils is connected to the input terminals of the diodes. Further, the fault detector 120 compares the voltage detection value generated from voltage of the diodes with the predetermined threshold value so as to detect the fault and sends the comparison result to the indicator 121. Thus, according to the first embodiment of the present invention, the threshold value used to detect the abnormal operation of the backlight assembly can be appropriately set and the abnormal operation can be precisely detected, even if the voltage rises in the backlight assembly 100 due to impedance variation caused by the temperature gradient.

That is, according to the first embodiment of the present invention, when impedance variation occurs due to the temperature gradient in the plural cold cathode fluorescent lamps 130, each paired third coils may generate voltages different from each other due to the difference in impedance, but AC voltages generated from the paired third coils, which are adjacent to each other, are offset from each other, so the threshold value can be set based on the differential voltage between the paired third coils. Thus, as compared with the conventional art, abnormal operation of the backlight assembly can be precisely detected even if the threshold value is set to a low level. Therefore, since the first embodiment of the present invention can appropriately set the threshold value, voltage variation can be precisely detected even if the voltage is slightly increased due to arc discharge caused by an opening fault and is below the threshold value under a condition of the conventional art. Thus, abnormal operation of the backlight assembly can be precisely detected.

In addition, according to the first embodiment of the present invention, only one diode is required for the paired third coils, which are adjacent to each other, so the number of diodes can be reduced as compared with the prior art in which a diode is provided for each third coil. Accordingly, the circuit structure can be simplified and the manufacturing cost can be reduced.

Embodiment 2

Figure 3:
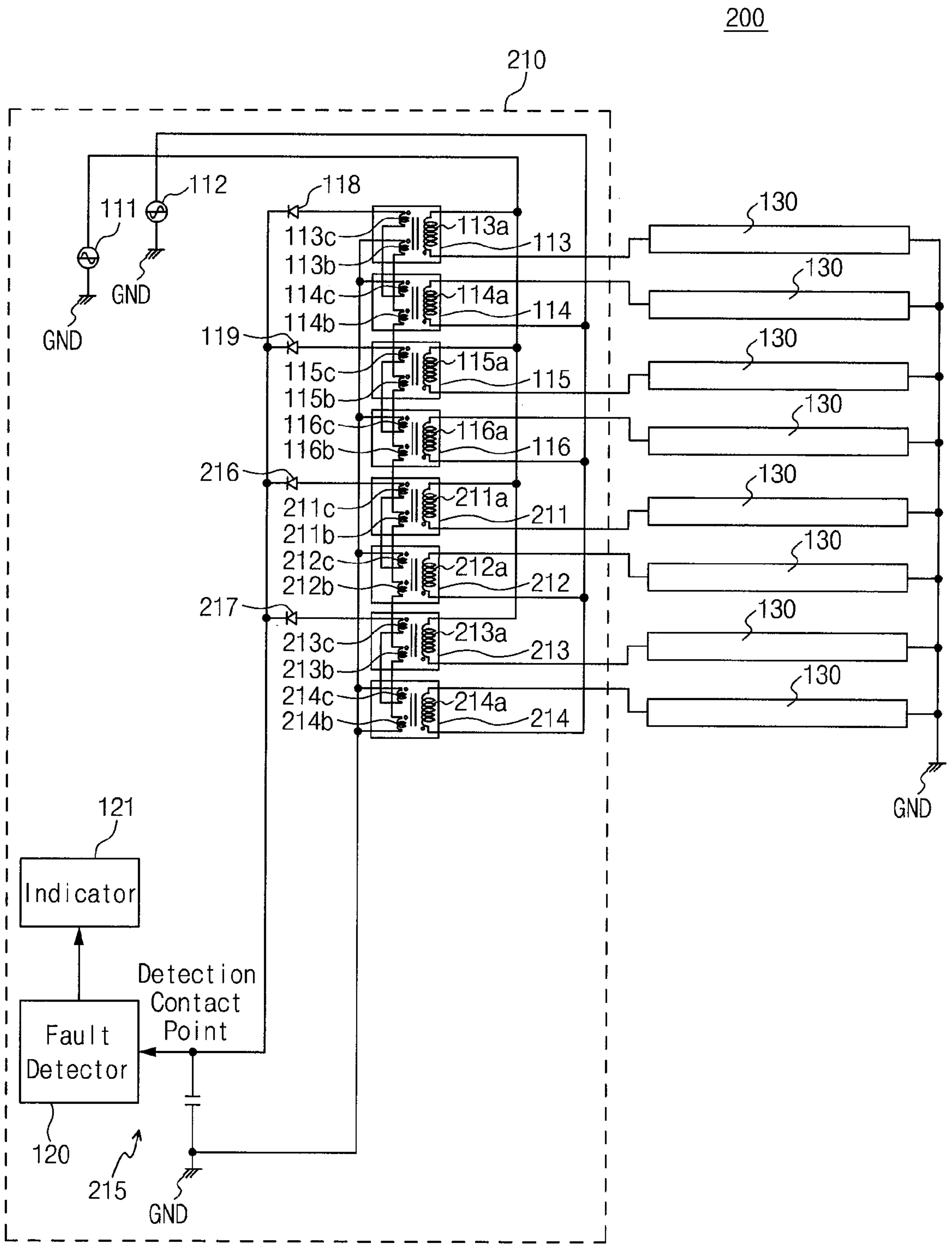
FIG. 3 is a circuit diagram showing an inverter circuit and a backlight assembly according to a second embodiment of the present invention.

Hereinafter, a second embodiment of the present invention will be described in detail with reference to accompanying drawings. FIG. 3 is a circuit diagram showing an inverter circuit and a backlight assembly according to the second embodiment of the present invention. The same reference numerals will be assigned to the elements identical to the elements shown in the first embodiment, and detailed description thereof will be omitted in order to avoid redundancy.

As shown in FIG. 3, the backlight assembly 200 according to the second embodiment of the present invention includes the inverter circuit 210 and four pairs of cold cathode fluorescent lamps (discharge tubes) 130.

The inverter circuit 210 includes two inverters 111 and 112, eight balance transformers 113, 114, 115, 116, 211, 212, 213 and 214, and a fault detection device 215. That is, the inverter circuit 210 according to the second embodiment of the present invention further includes balance transformers 211, 212, 213 and 214 as compared with the inverter circuit 110 according to the first embodiment of the present invention, and the fault detection device 215 is provided instead of the fault detection device 117. The inverter 111 converts DC voltage into AC voltage so as to apply positive AC voltage to the four pairs of the cold cathode fluorescent lamps 130 through primary coils 113a, 115a, 211a and 213a of the balance transformers 113, 115, 211 and 213. The inverter 112 converts DC voltage into AC voltage so as to apply negative AC voltage, which has amplitude identical to that of the positive AC voltage and the phase thereof is shifted by 180° as compared with that of the positive AC voltage, to the four pairs of the cold cathode fluorescent lamps 130 through primary coils 114*a*, 116*a*, 212*a* and 214*a* of the balance transformers 114, 116, 212 and 214.

The balance transformer 211 has the primary coil 211*a* connected to the inverter 111 in parallel to the balance transformers 113 and 115 and disposed between the output terminal of the inverter 111 and the cold cathode fluorescent lamp 130. In addition, the balance transformer 212 has the primary coil 212*a* connected to the inverter 112 in parallel to the balance transformers 114 and 116 and disposed between the output terminal of the inverter 112 and the cold cathode fluorescent lamp 130. Further, the balance transformer 213 has the primary coil 213*a* connected to the inverter 111 in parallel to the balance transformers 113 and 115 and disposed between the output terminal of the inverter 111 and the cold cathode fluorescent lamp 130. The balance transformer 214 has the primary coil 214*a* connected to the inverter 112 in parallel to the balance transformers 114 and 116 and disposed between the output terminal of the inverter 112 and the cold cathode fluorescent lamp 130.

AC voltage is induced to the secondary coils 211*b* and 212*b* and third coils 211*c* and 212*c* by AC voltage applied to the primary coils 211*a* and 212*a*. In addition, AC voltage is induced to the secondary coils 213*b* and 214*b* and third coils 213*c* and 214*c* by AC voltage applied to the primary coils 213*a* and 214*a*.

Among the secondary coils 211*b*, 212*b*, 213*b* and 214*b* of the four balance transformers 211, 212, 213 and 214, adjacent coils are serially connected to each other to form a serial loop, and a part of the secondary coil serial loop is connected to the ground GND. The secondary coils 211*b*, 212*b*, 213*b* and 214*b* of four balance transformers 211, 212, 213 and 214 generate voltage detection values of the AC voltage induced by the primary coils 211*a*, 212*a*, 213*a*, and 214*a* and transmit the voltage detection values to a fault detector 120.

The fault detection device 215 detects high voltage abnormal discharge in the inverter circuit 210, such as corona discharge and arc discharge that are generated when a defect occurs in an insulator provided between a high voltage section and the ground GND. The fault detection device 215 detects the abnormal operation based on the voltage detection values generated from voltages of the eight balance transformers 113, 114, 115, 116, 211, 212, 213 and 214.

The fault detection device 215 includes four pairs of third coils 113*c*, 114*c*, 115*c*, 116*c*, 211*c*, 212*c*, 213*c* and 214*c* added to the eight balance transformers 113, 114, 115, 116, 211, 212, 213 and 214, four diodes 118, 119, 216 and 217, the fault detector 120 and an indicator 121. That is, the fault detection device 215 according to the second embodiment of the present invention further includes two pairs of third coils 211*c*, 212*c*, 213*c* and 214*c* and two diodes 216 and 217 as compared with the fault detection device 117 according to the first embodiment of the present invention.

Among the third coils 211*c*, 212*c*, 213*c* and 214*c*, adjacent third coils, which are aligned as a pair, are serially connected to each other so as to offset AC voltage generated from the paired third coils, one end of the paired third coils is connected to the secondary coil serial loop. In addition, one end of the paired third coils can be directly connected to the ground GND, other than connected to the ground GND through the secondary coil serial loop.

That is, the paired third coils 211*c* and 212*c* are serially connected to each other so as to offset AC voltage generated from the paired third coils 211*c* and 212*c*, one end of the paired third coils 211*c* and 212*c* is connected to the ground GND by way of the serial loop of the secondary coils 113*b*, 114*b*, 115*b*, 116*b*, 211*b*, 212*b*, 213*b* and 214*b*.

In addition, the paired third coils 213*c* and 214*c* are serially connected to each other so as to offset AC voltage generated from the paired third coils 213*c* and 214*c*, one end of the paired third coils 213*c* and 214*c* is connected to the ground GND by way of the serial loop of the secondary coils 113*b*, 114*b*, 115*b*, 116*b*, 211*b*, 212*b*, 213*b* and 214*b*.

Input terminals of the diodes 216 and 217 are connected to the paired third coils so as to detect ripple voltage generated from the paired third coils and then produce the voltage detection value. The voltage detection value is output from the ripple DC voltage converter 1201 of the fault detector 120.

That is, the input terminal of the diode 216 is connected to the paired third coils 211*c* and 212*c* in order to produce the voltage detection value by detecting the ripple voltage generated from the paired third coils 211*c* and 212*c*.

In addition, the input terminal of the diode 217 is connected to the paired third coils 213*c* and 214*c* in order to produce the voltage detection value by detecting the ripple voltage generated from the paired third coils 213*c* and 214*c*.

Embodiment 3

Figure 4:
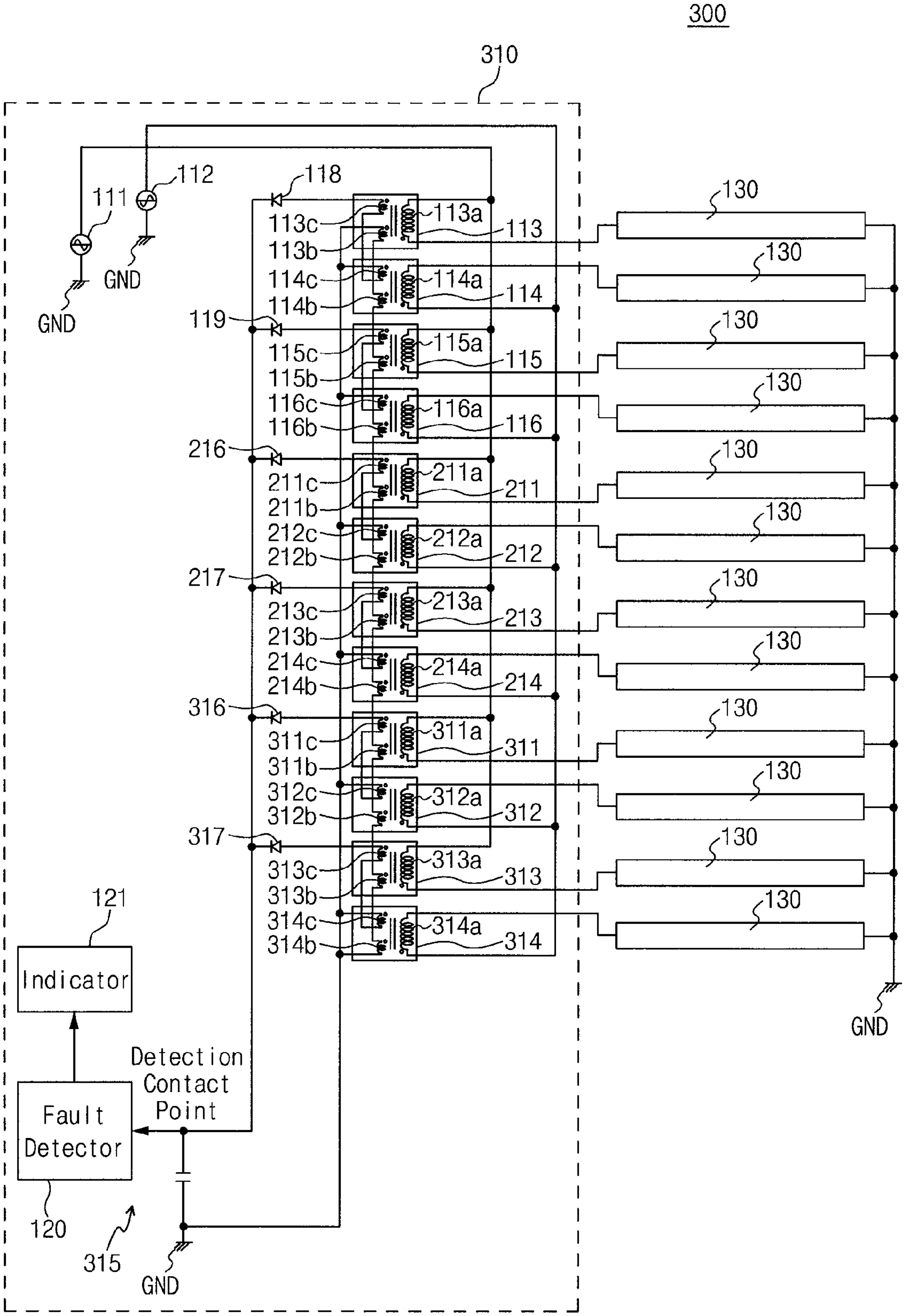
FIG. 4 is a circuit diagram showing an inverter circuit and a backlight assembly according to a third embodiment of the present invention.

Hereinafter, a third embodiment of the present invention will be described in detail with reference to accompanying drawings. FIG. 4 is a circuit diagram showing an inverter circuit and a backlight assembly according to the third embodiment of the present invention. The same reference numerals will be assigned to the elements identical to the elements shown in the second embodiment, and detailed description thereof will be omitted in order to avoid redundancy.

As shown in FIG. 4, the backlight assembly 300 according to the third embodiment of the present invention includes the inverter circuit 310 and six pairs of cold cathode fluorescent lamps (discharge tubes) 130.

The inverter circuit 310 includes two inverters 111 and 112, twelve balance transformers 113, 114, 115, 116, 211, 212, 213, 214, 311, 312, 313 and 314, and a fault detection device 315. That is, the inverter circuit 310 according to the third embodiment of the present invention further includes balance transformers 311, 312, 313 and 314 as compared with the inverter circuit 210 according to the second embodiment of the present invention, and the fault detection device 315 is provided instead of the fault detection device 215.

The inverter 111 converts DC voltage into AC voltage so as to apply positive AC voltage to the six pairs of the cold cathode fluorescent lamps 130 through primary coils 113*a*, 115*a*, 211*a*, 213*a*, 311*a* and 313*a* of the balance transformers 113, 115, 211, 213, 311 and 313. The inverter 112 converts DC voltage into AC voltage so as to apply negative AC voltage, which has amplitude identical to that of the positive AC voltage and the phase thereof is shifted by 180° as compared with that of the positive AC voltage, to the six pairs of the cold cathode fluorescent lamps 130 through primary coils 114*a*, 116*a*, 212*a*, 214*a*, 312*a* and 314*a* of the balance transformers 114, 116, 212, 214, 312 and 314.

The balance transformer 311 has the primary coil 311*a* connected to the inverter 111 in parallel to the balance transformers 113, 115, 211 and 213 and disposed between the output terminal of the inverter 111 and the cold cathode fluorescent lamp 130. In addition, the balance transformer 312 has the primary coil 312*a* connected to the inverter 112 in parallel to the balance transformers 114, 116, 212 and 214 and disposed between the output terminal of the inverter 112 and the cold cathode fluorescent lamp 130. Further, the balance transformer 313 has the primary coil 313*a* connected to the inverter 111 in parallel to the balance transformers 113, 115, 211 and 213 and disposed between the output terminal of the inverter 111 and the cold cathode fluorescent lamp 130. The balance transformer 314 has the primary coil 314*a* connected to the inverter 112 in parallel to the balance transformers 114, 116, 212 and 214 and disposed between the output terminal of the inverter 112 and the cold cathode fluorescent lamp 130.

AC voltage applied to the primary coils 311*a* and 312*a* is induced to the secondary coils 311*b* and 312*b* and third coils 311*c* and 312*c* by AC voltage applied to the primary coils 311*a* and 312*a*. In addition, AC voltage is induced to the secondary coils 313*b* and 314*b* and third coils 313*c* and 314*c* by AC voltage applied to the primary coils 313*a* and 314*a*.

Among the secondary coils 311*b*, 312*b*, 313*b* and 314*b* of the four balance transformers 311, 312, 313 and 314, adjacent secondary coils are serially connected to each other to form a serial loop, and a part of the secondary coil serial loop is connected to the ground GND. The secondary coils 311*b*, 312*b*, 313*b* and 314*b* of four balance transformers 311, 312, 313 and 314 generate voltage detection values of the AC voltage induced by the primary coils 311*a*, 312*a*, 313*a*, and 314*a* and transmit the voltage detection values to a fault detector 120.

The fault detection device 315 detects high voltage abnormal discharge in the inverter circuit 310, such as corona discharge and arc discharge that are generated when a defect occurs in an insulator provided between a high voltage section and the ground GND. The fault detection device 315 detects the abnormal operation based on the voltage detection values generated from voltages of the twelve balance transformers 113, 114, 115, 116, 211, 212, 213, 214, 311, 312, 313 and 314.

The fault detection device 315 includes six pairs of third coils 113*c*, 114*c*, 115*c*, 116*c*, 211*c*, 212*c*, 213*c*, 214*c*, 311*c*, 312*c*, 313*c* and 314*c* added to the twelve balance transformers 113, 114, 115, 116, 211, 212, 213, 214, 311, 312, 313, and 314, six diodes 118, 119, 216, 217, 316 and 317, the fault detector 120 and an indicator 121. That is, the fault detection device 315 according to the third embodiment of the present invention further includes two pairs of third coils 311*c*, 312*c*, 313*c* and 314*c* and two diodes 316 and 317 as compared with the fault detection device 215 according to the second embodiment of the present invention.

Among the third coils 311*c*, 312*c*, 313*c* and 314*c*, adjacent third coils, which are aligned as a pair, are serially connected to each other so as to offset AC voltage generated from the paired third coils, one end of the paired third coils is connected to the secondary coil serial loop. In addition, one end of the paired third coils can be directly connected to the ground GND, other than connected to the ground GND through the secondary coil serial loop.

That is, the paired third coils 311*c* and 312*c* adjacent to each other are serially connected to each other so as to offset AC voltage generated from the paired third coils 311*c* and 312*c*, one end of the paired third coils 311*c* and 312*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

In addition, the paired third coils 313*c* and 314*c* adjacent to each other are serially connected to each other so as to offset AC voltage generated from the paired third coils 313*c* and 314*c*, one end of the paired third coils 313*c* and 314*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

Input terminals of the diodes 316 and 317 are connected to the paired third coils so as to detect ripple voltage generated from the paired third coils and then produce the voltage detection value. The voltage detection value is output from the ripple DC voltage converter 1201 of the fault detector 120.

That is, the input terminal of the diode 316 is connected to the paired third coils 311*c* and 312*c* adjacent to each other in order to produce the voltage detection value by detecting the ripple voltage generated from the paired third coils 311*c* and 312*c*.

In addition, the input terminal of the diode 317 is connected to the paired third coils 313*c* and 314*c* adjacent to each other in order to produce the voltage detection value by detecting the ripple voltage generated from the paired third coils 313*c* and 314*c*.

Embodiment 4

Figure 5:
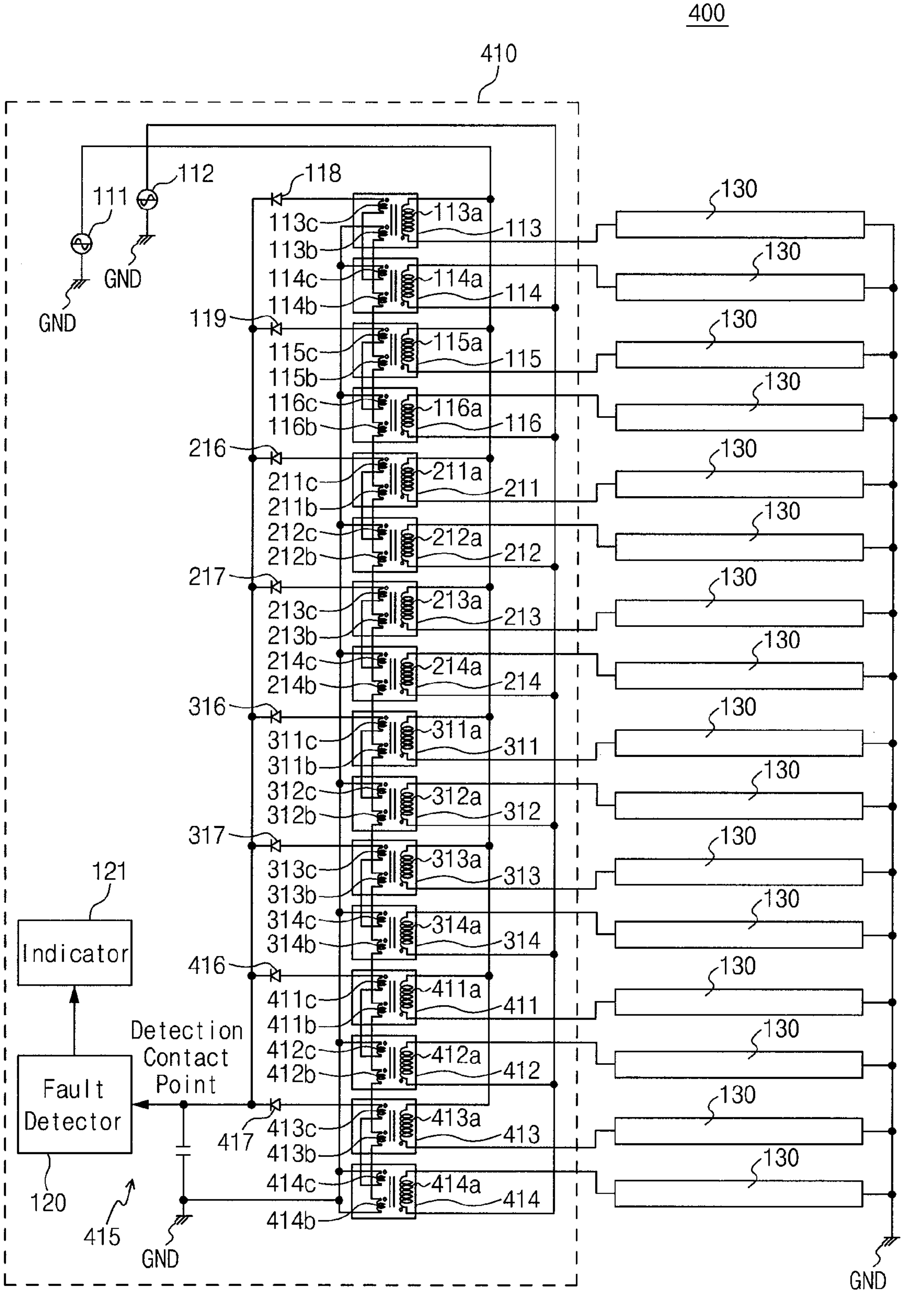
FIG. 5 is a circuit diagram showing an inverter circuit and a backlight assembly according to a fourth embodiment of the present invention.

Hereinafter, a fourth embodiment of the present invention will be described in detail with reference to accompanying drawings. FIG. 5 is a circuit diagram showing an inverter circuit and a backlight assembly according to the fourth embodiment of the present invention. The same reference numerals will be assigned to the elements identical to the elements shown in the third embodiment, and detailed description thereof will be omitted in order to avoid redundancy.

As shown in FIG. 5, the backlight assembly 400 according to the fourth embodiment of the present invention includes the inverter circuit 410 and eight pairs of cold cathode fluorescent lamps (discharge tubes) 130.

The inverter circuit 410 includes two inverters 111 and 112, sixteen balance transformers 113, 114, 115, 116, 211, 212, 213, 214, 311, 312, 313, 314, 411, 412, 413 and 414, and a fault detection device 415. That is, the inverter circuit 410 according to the fourth embodiment of the present invention further includes balance transformers 411, 412, 413 and 414 as compared with the inverter circuit 310 according to the third embodiment of the present invention, and the fault detection device 415 is provided instead of the fault detection device 315.

The inverter 111 converts DC voltage into AC voltage so as to apply positive AC voltage to the eight pairs of the cold cathode fluorescent lamps 130 through primary coils 113*a*, 115*a*, 211*a*, 213*a*, 311*a*, 313*a*, 411*a* and 413*a* of the balance transformers 113, 115, 211, 213, 311, 313, 411 and 413. The inverter 112 converts DC voltage into AC voltage so as to apply negative AC voltage, which has amplitude identical to that of the positive AC voltage and the phase thereof is shifted by 180° as compared with that of the positive AC voltage, to the eight pairs of the cold cathode fluorescent lamps 130 through primary coils 114*a*, 116*a*, 212*a*, 214*a*, 312*a*, 314*a*, 412*a* and 414*a* of the balance transformers 114, 116, 212, 214, 312, 314, 412 and 414.

The balance transformer 411 has the primary coil 411*a* connected to the inverter 111 in parallel to the balance transformers 113, 115, 211, 213, 311 and 313 and disposed between the output terminal of the inverter 111 and the cold cathode fluorescent lamp 130. In addition, the balance transformer 412 has the primary coil 412*a* connected to the inverter 112 in parallel to the balance transformers 114, 116, 212, 214, 312 and 314 and disposed between the output terminal of the inverter 112 and the cold cathode fluorescent lamp 130. Further, the balance transformer 413 has the primary coil 413*a* connected to the inverter 111 in parallel to the balance transformers 113, 115, 211, 213, 311 and 313 and disposed between the output terminal of the inverter 111 and the cold cathode fluorescent lamp 130. The balance transformer 414 has the primary coil 414*a* connected to the inverter 112 in parallel to the balance transformers 114, 116, 212, 214, 312 and 314 and disposed between the output terminal of the inverter 112 and the cold cathode fluorescent lamp 130.

AC voltage is induced to the secondary coils 411*b* and 412*b* and third coils 411*c* and 412*c* by AC voltage applied to the primary coils 411*a* and 412*a*. In addition, AC voltage is induced to the secondary coils 413*b* and 414*b* and third coils 413*c* and 414*c* by AC voltage applied to the primary coils 413*a* and 414*a*.

Among the secondary coils 411*b*, 412*b*, 413*b* and 414*b* of the four balance transformers 411, 412, 413 and 414, adjacent secondary coils are serially connected to each other to form a serial loop, and a part of the secondary coil serial loop is connected to the ground GND. The secondary coils 411*b*, 412*b*, 413*b* and 414*b* of four balance transformers 411, 412, 413 and 414 generate voltage detection values of the AC voltage induced by the primary coils 411*a*, 412*a*, 413*a*, and 414*a* and transmit the voltage detection values to a fault detector 120.

The fault detection device 415 detects high voltage abnormal discharge in the inverter circuit 410, such as corona discharge and arc discharge that are generated when a defect occurs in an insulator provided between a high voltage section and the ground GND. The fault detection device 415 detects the abnormal operation based on the voltage detection values generated from voltages of the sixteen balance transformers 113, 114, 115, 116, 211, 212, 213, 214, 311, 312, 313, 314, 411, 412, 413 and 414.

The fault detection device 415 includes eight pairs of third coils 113*c*, 114*c*, 115*c*, 116*c*, 211*c*, 212*c*, 213*c*, 214*c*, 311*c*, 312*c*, 313*c*, 314*c*, 411*c*, 412*c*, 413*c* and 414*c* added to the sixteen balance transformers 113, 114, 115, 116, 211, 212, 213, 214, 311, 312, 313, 314, 411, 412, 413, and 414, eight diodes 118, 119, 216, 217, 316, 317, 416 and 417, the fault detector 120 and an indicator 121. That is, the fault detection device 415 according to the fourth embodiment of the present invention further includes two pairs of third coils 411*c*, 412*c*, 413*c* and 414*c* and two diodes 416 and 417 as compared with the fault detection device 315 according to the third embodiment of the present invention.

Among the third coils 411*c*, 412*c*, 413*c* and 414*c*, adjacent third coils, which are aligned as a pair, are serially connected to each other so as to offset AC voltage generated from the paired third coils, one end of the paired third coils is connected to the secondary coil serial loop. In addition, one end of the paired third coils can be directly connected to the ground GND, other than connected to the ground GND through the secondary coil serial loop.

That is, the paired third coils 411*c* and 412*c* adjacent to each other are serially connected to each other so as to offset AC voltage generated from the paired third coils 411*c* and 412*c*, and one end of the paired third coils 411*c* and 412*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

In addition, the paired third coils 413*c* and 414*c* adjacent to each other are serially connected to each other so as to offset AC voltage generated from the paired third coils 413*c* and 414*c*, and one end of the paired third coils 413*c* and 414*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

Input terminals of the diodes 416 and 417 are connected to the paired third coils so as to detect ripple voltage generated from the paired third coils and then produce the voltage detection value. The voltage detection value is output from the ripple DC voltage converter 1201 of the fault detector 120.

That is, the input terminal of the diode 416 is connected to the paired third coils 411*c* and 412*c* adjacent to each other in order to produce the voltage detection value by detecting the ripple voltage generated from the paired third coils 411*c* and 412*c*.

In addition, the input terminal of the diode 417 is connected to the paired third coils 413*c* and 414*c* adjacent to each other in order to produce the voltage detection value by detecting the ripple voltage generated from the paired third coils 413*c* and 414*c*.

Embodiment 5

Figure 6:
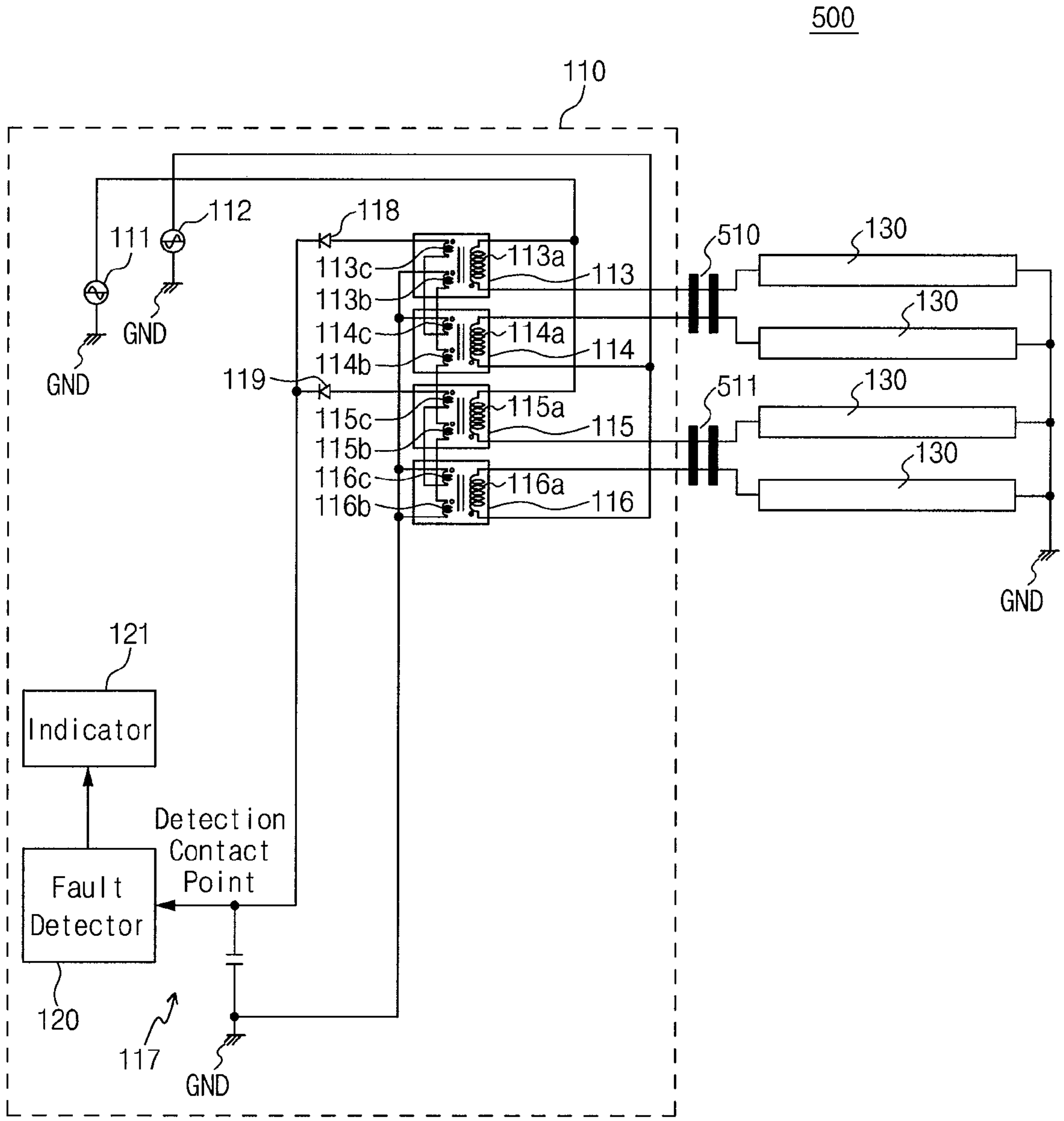
FIG. 6 is a circuit diagram showing an inverter circuit and a backlight assembly according to a fifth embodiment of the present invention.

Hereinafter, a fifth embodiment of the present invention will be described in detail with reference to accompanying drawings. FIG. 6 is a circuit diagram showing an inverter circuit and a backlight assembly according to the fifth embodiment of the present invention. The same reference numerals will be assigned to the elements identical to the elements shown in the first embodiment, and detailed description thereof will be omitted in order to avoid redundancy.

As shown in FIG. 6, the backlight assembly 500 according to the fifth embodiment of the present invention includes the inverter circuit 110, two pairs of cold cathode fluorescent lamps (discharge tubes) 130, and two lamp connectors 510 and 511. That is, the backlight assembly 500 according to the fifth embodiment of the present invention further includes the lamp connectors 510 and 511 as compared with the backlight assembly 100 according to the first embodiment of the present invention.

The lamp connectors 510 and 511 combine adjacent cold cathode fluorescent lamps 130 with each other, respectively. In addition, the lamp connectors 510 and 511 connect the cold cathode fluorescent lamps 130 to the inverters 111 and 112 through primary coils 113*a*, 114*a*, 115*a* and 116*a* of the balance transformers 113, 114, 115 and 116, respectively.

That is, the lamp connector 510 connects a pair of the cold cathode fluorescent lamps 130 to the inverters 111 and 112 through primary coils 113*a* and 114*a* of the balance transformers 113 and 114, respectively.

In addition, the lamp connector 511 connects a pair of the cold cathode fluorescent lamps 130 to the inverters 111 and 112 through primary coils 115*a* and 116*a* of the balance transformers 115 and 116, respectively.

According to the fifth embodiment of the present invention, when plural pairs of cold cathode fluorescent lamps are connected to the balance transformers, two cold cathode fluorescent lamps are combined by means of the connector, so that the fifth embodiment is more efficient than the first embodiment. Further, workability can be improved when installing or exchanging the cold cathode fluorescent lamps, so the manufacturing cost can be reduced.

Embodiment 6

Figure 7:
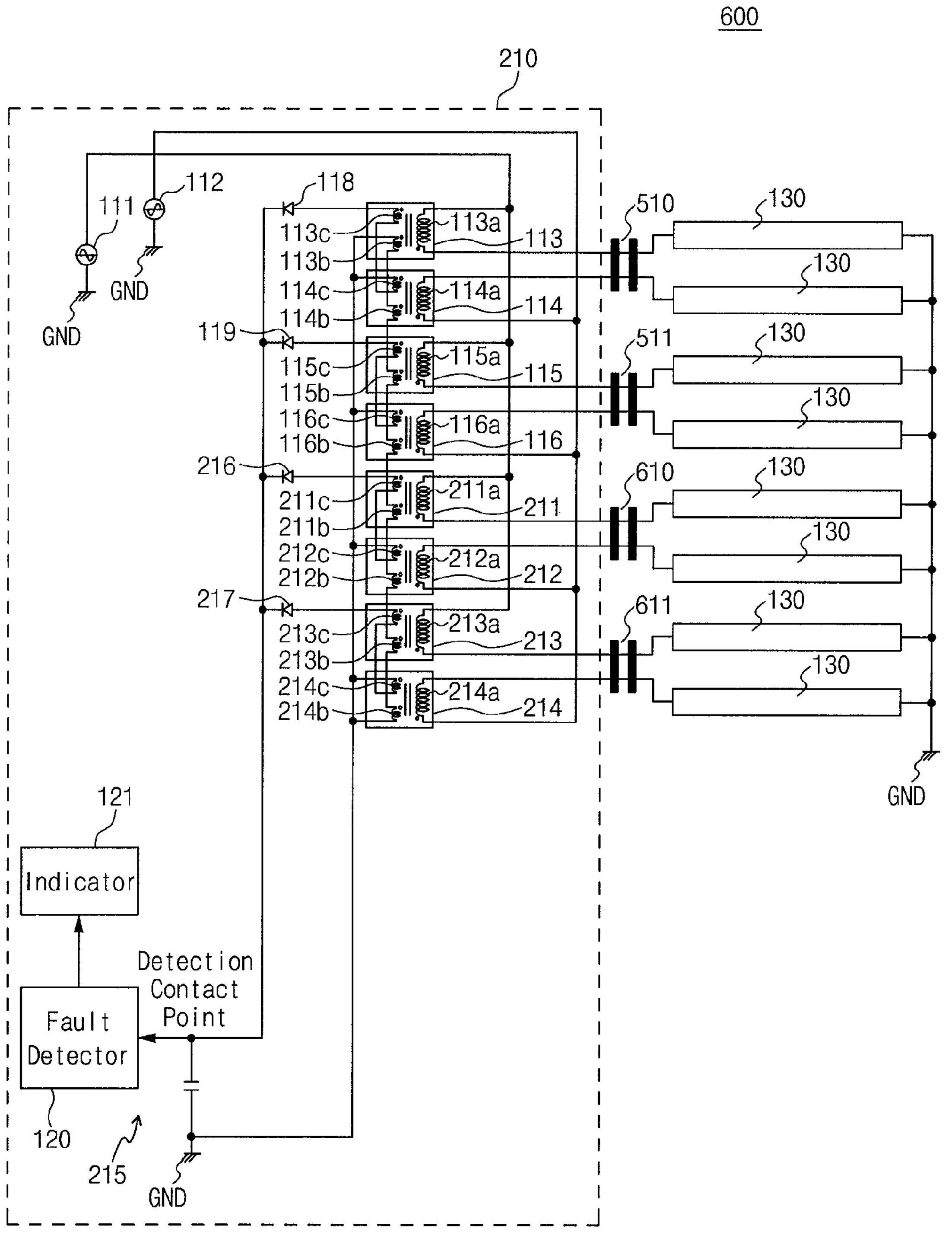
FIG. 7 is a circuit diagram showing an inverter circuit and a backlight assembly according to a sixth embodiment of the present invention.

Hereinafter, a sixth embodiment of the present invention will be described in detail with reference to accompanying drawings. FIG. 7 is a circuit diagram showing an inverter circuit and a backlight assembly according to the sixth embodiment of the present invention. The same reference numerals will be assigned to the elements identical to the elements shown in the second and fifth embodiments, and detailed description thereof will be omitted in order to avoid redundancy.

As shown in FIG. 7, the backlight assembly 600 according to the sixth embodiment of the present invention includes the inverter circuit 210, four pairs of cold cathode fluorescent lamps (discharge tubes) 130, and four lamp connectors 510, 511, 610 and 611. That is, the backlight assembly 600 according to the sixth embodiment of the present invention further includes the lamp connectors 610 and 611 as compared with the backlight assemblies 200 and 500 according to the second and fifth embodiments of the present invention.

The lamp connectors 610 and 611 combine two pairs of adjacent cold cathode fluorescent lamps 130 with each other among a plurality of cold cathode fluorescent lamps 130. In addition, the lamp connectors 610 and 611 connect the cold cathode fluorescent lamps 130 to the inverters 111 and 112 through primary coils 211*a*, 212*a*, 213*a* and 214*a* of the four balance transformers 211, 212, 213 and 214, respectively.

That is, the lamp connector 610 connects a pair of the cold cathode fluorescent lamps 130 to the inverters 111 and 112 through primary coils 211*a* and 212*a* of the balance transformers 211 and 212, respectively.

In addition, the lamp connector 611 connects a pair of the cold cathode fluorescent lamps 130 to the inverters 111 and 112 through primary coils 213*a* and 214*a* of the balance transformers 213 and 214, respectively.

Embodiment 7

Figure 8:
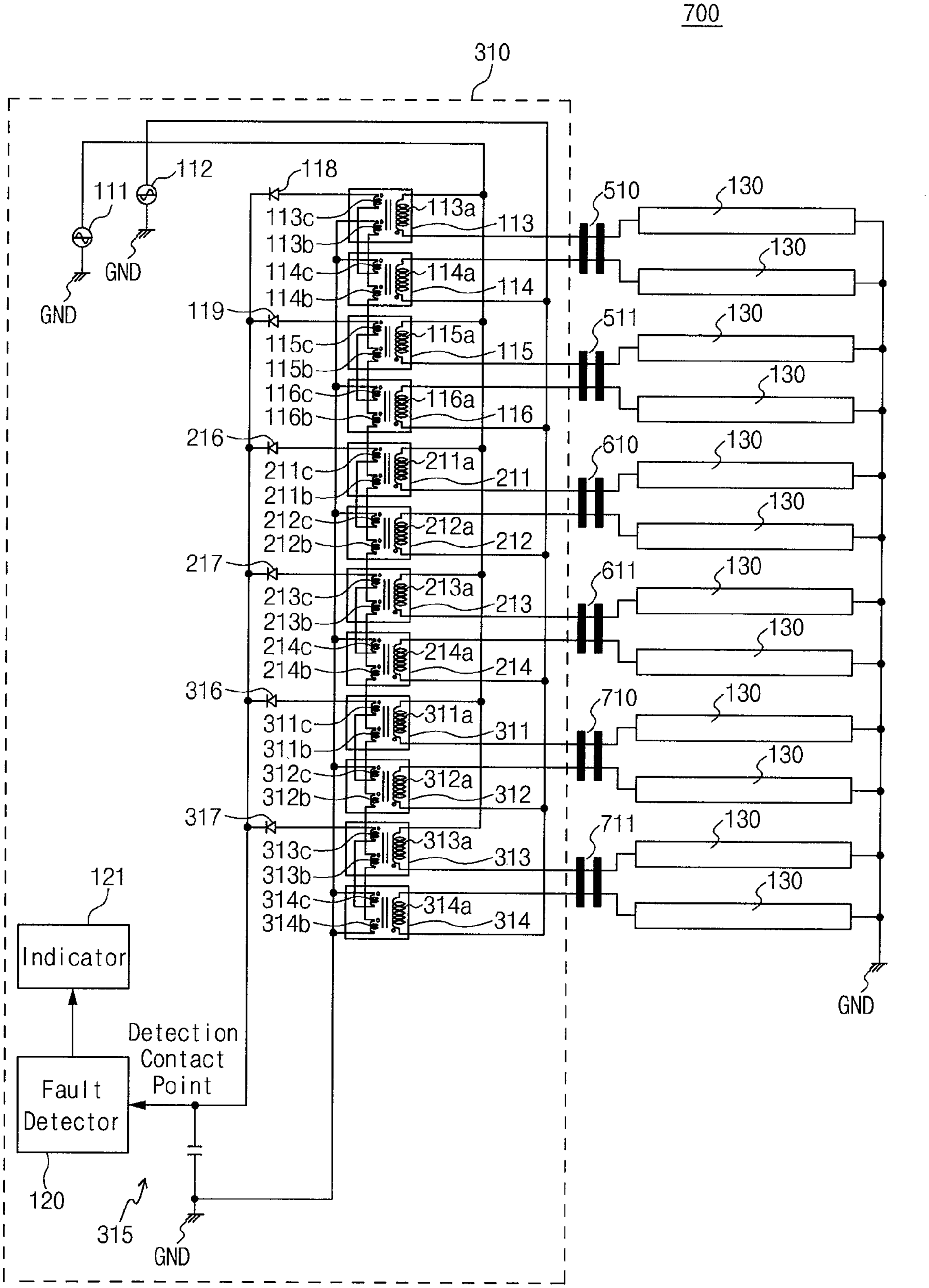
FIG. 8 is a circuit diagram showing an inverter circuit and a backlight assembly according to a seventh embodiment of the present invention.

Hereinafter, a seventh embodiment of the present invention will be described in detail with reference to accompanying drawings. FIG. 8 is a circuit diagram showing an inverter circuit and a backlight assembly according to the seventh embodiment of the present invention. The same reference numerals will be assigned to the elements identical to the elements shown in the third and sixth embodiments, and detailed description thereof will be omitted in order to avoid redundancy.

As shown in FIG. 8, the backlight assembly 700 according to the seventh embodiment of the present invention includes the inverter circuit 310, six pairs of cold cathode fluorescent lamps (discharge tubes) 130, and six lamp connectors 510, 511, 610, 611, 710 and 711. That is, the backlight assembly 700 according to the seventh embodiment of the present invention further includes the lamp connectors 710 and 711 as compared with the backlight assemblies 300 and 600 according to the third and sixth embodiments of the present invention.

The lamp connectors 710 and 711 combine two pairs of adjacent cold cathode fluorescent lamps 130 with each other among a plurality of cold cathode fluorescent lamps 130. In addition, the lamp connectors 710 and 711 connect the cold cathode fluorescent lamps 130 to the inverters 111 and 112 through primary coils 311*a*, 312*a*, 313*a* and 314*a* of the four balance transformers 311, 312, 313 and 314, respectively.

That is, the lamp connector 710 connects a pair of the cold cathode fluorescent lamps 130 to the inverters 111 and 112 through primary coils 311*a* and 312*a* of the balance transformers 311 and 312, respectively.

In addition, the lamp connector 711 connects a pair of the cold cathode fluorescent lamps 130 to the inverters 111 and 112 through primary coils 313*a* and 314*a* of the balance transformers 313 and 314, respectively.

Embodiment 8

Figure 9:
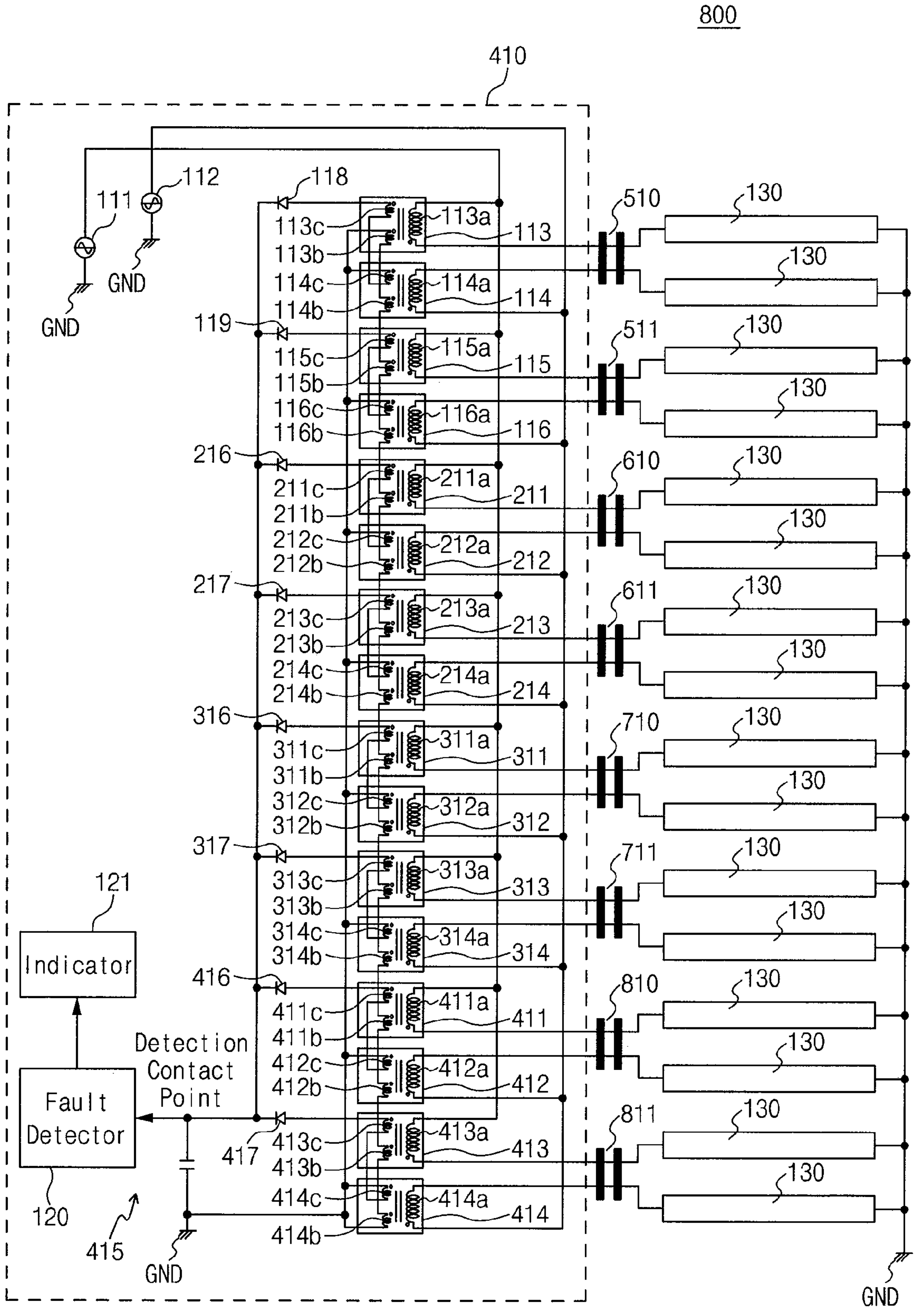
FIG. 9 is a circuit diagram showing an inverter circuit and a backlight assembly according to an eighth embodiment of the present invention.

Hereinafter, an eighth embodiment of the present invention will be described in detail with reference to accompanying drawings. FIG. 9 is a circuit diagram showing an inverter circuit and a backlight assembly according to the eighth embodiment of the present invention. The same reference numerals will be assigned to the elements identical to the elements shown in the fourth and sixth embodiments, and detailed description thereof will be omitted in order to avoid redundancy.

As shown in FIG. 9, the backlight assembly 800 according to the eighth embodiment of the present invention includes the inverter circuit 410, eight pairs of cold cathode fluorescent lamps (discharge tubes) 130, and eight lamp connectors 510, 511, 610, 611, 710, 711, 810 and 811. That is, the backlight assembly 800 according to the eighth embodiment of the present invention further includes the lamp connectors 810 and 811 as compared with the backlight assemblies 400 and 700 according to the fourth and seventh embodiments of the present invention.

The lamp connectors 810 and 811 combine two pairs of adjacent cold cathode fluorescent lamps 130 with each other among a plurality of cold cathode fluorescent lamps 130. In addition, the lamp connectors 810 and 811 connect the cold cathode fluorescent lamps 130 to the inverters 111 and 112 through primary coils 411*a*, 412*a*, 413*a* and 414*a* of the four balance transformers 411, 412, 413 and 414, respectively.

That is, the lamp connector 810 connects a pair of the cold cathode fluorescent lamps 130 to the inverters 111 and 112 through primary coils 411*a* and 412*a* of the balance transformers 411 and 412, respectively.

In addition, the lamp connector 811 connects a pair of the cold cathode fluorescent lamps 130 to the inverters 111 and 112 through primary coils 413*a* and 414*a* of the balance transformers 413 and 414, respectively.

Embodiment 9

Figure 10:
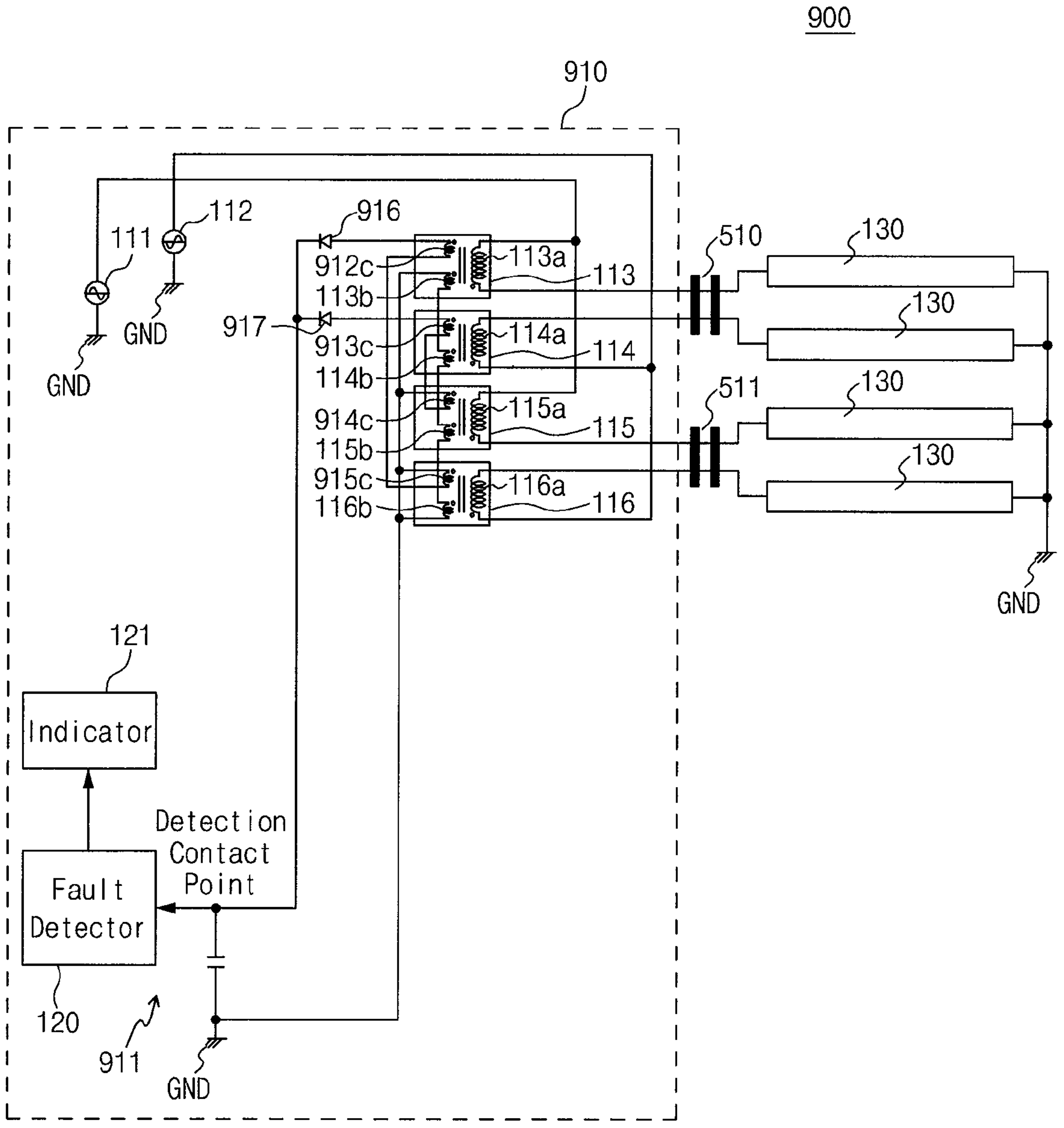
FIG. 10 is a circuit diagram showing an inverter circuit and a backlight assembly according to a ninth embodiment of the present invention.

Hereinafter, a ninth embodiment of the present invention will be described in detail with reference to accompanying drawings. FIG. 10 is a circuit diagram showing an inverter circuit and a backlight assembly according to the ninth embodiment of the present invention. The same reference numerals will be assigned to the elements identical to the elements shown in the first and fifth embodiments, and detailed description thereof will be omitted in order to avoid redundancy.

As shown in FIG. 10, the backlight assembly 900 according to the ninth embodiment of the present invention includes the inverter circuit 910, two pairs of cold cathode fluorescent lamps (discharge tubes) 130, and two lamp connectors 510 and 511.

The inverter circuit 910 includes two inverters 111 and 112, four balance transformers 113, 114, 115 and 116, and a fault detection device 911. That is, the inverter circuit 910 according to the ninth embodiment of the present invention is identical to the inverter circuit 110 according to the first embodiment of the present invention, except for the structure of the fault detection device 911.

The fault detection device 911 detects high voltage abnormal discharge in the inverter circuit 910, such as corona discharge and arc discharge that are generated when a defect occurs in an insulator provided between a high voltage section and the ground GND. The fault detection device 911 detects the abnormal operation based on the voltage detection values generated from voltages of the balance transformers 113, 114, 115 and 116.

The fault detection device 911 includes third coils 912*c*, 913*c*, 914*c*, and 915*c* added to balance transformers 113, 114, 115 and 116, two diodes 916 and 917, a fault detector 120 and an indicator 121.

Among the third coils 912_c_, 913_c_, 914_c_, and 915_c_, paired third coils, to which AC voltage is induced from primary coils connected to different connectors, are serially connected to each other so as to offset AC voltage generated from the paired third coils, and one end of the paired third coils is connected to the secondary coil serial loop. In addition, one end of the paired third coils can be directly connected to the ground GND, other than connected to the ground GND through the secondary coil serial loop.

That is, the paired third coils 912_c_ and 915_c_ are serially connected to each other so as to offset AC voltage generated from the paired third coils 912_c_ and 915_c_, in which the AC voltage is induced to the paired third coils 912_c_ and 915_c_ from the primary coils 113_a_ and 116_a_ connected to different connectors 510 and 511, respectively. One end of the paired third coils 912_c_ and 915_c_ is connected to the ground GND by way of the serial loop of the secondary coils 113_b_, 114_b_, 115_b_ and 116_b_.

In addition, the paired third coils 913_c_ and 914_c_ are serially connected to each other so as to offset AC voltage generated from the paired third coils 913_c_ and 914_c_, in which the AC voltage is induced to the paired third coils 913_c_ and 914_c_ from the primary coils 114_a_ and 115_a_ connected to different connectors 510 and 511, respectively. One end of the paired third coils 913_c_ and 914_c_ is connected to the ground GND by way of the serial loop of the secondary coils 113_b_, 114_b_, 115_b_ and 116_b_.

Input terminals of the diodes 916 and 917 are connected to one end of the paired third coils so as to detect ripple voltage generated from the paired third coils and then produce the voltage detection value.

That is, the input terminal of the diode 916 is connected to one end of the paired third coils 912_c_ and 915_c_, to which the AC voltage is induced from the primary coils 113_a_ and 116_a_ connected to different connectors 510 and 511, respectively, in order to produce the voltage detection value by detecting the ripple voltage generated from the paired third coils 912_c_ and 915_c_.

In addition, the input terminal of the diode 917 is connected to one end of the paired third coils 913_c_ and 914_c_, to which the AC voltage is induced from the primary coils 114_a_ and 115_a_ connected to different connectors 510 and 511, in order to produce the voltage detection value by detecting the ripple voltage generated from the paired third coils 913_c_ and 914_c_.

The fault detector 120 is connected to output terminals of the diodes 916 and 917. The fault detector 120 compares the voltage detection value generated from voltage of the diodes 916 and 917 with the predetermined threshold value so as to detect the fault and generates the comparison result. The comparison result is output by the indicator 121.

According to the ninth embodiment of the present invention, the paired third coils, to which the AC voltage is induced from the primary coils connected to different connectors, are serially connected to each other so that the AC voltages generated from the paired third coils are offset. In addition, one end of the paired third coils is connected to the input terminals of the diodes. Further, the fault detector 120 compares the voltage detection value generated from voltage of the diodes with the predetermined threshold value so as to detect the fault and sends the comparison result to the indicator 121. Thus, according to the ninth embodiment of the present invention, the threshold value used to detect the abnormal operation of the backlight assembly can be appropriately set and the abnormal operation can be precisely detected, even if the opening fault of the cold cathode fluorescent lamps occurs in the backlight assembly.

That is, according to the ninth embodiment of the present invention, even if the opening fault occurs in the connector that combines a pair of cold cathode fluorescent lamps with each other, since the third coil to which the AC voltage is induced from the primary coil connected between the connector and the output terminal of the inverter, is serially connected to another third coil to which the AC voltage is induced from the primary coil connected to the other connector, the AC voltage generated from the pair of third coils is offset from each other, so that the abnormal operation of the backlight assembly can be precisely detected.

In addition, according to the ninth embodiment of the present invention, only one diode is required for the paired third coils, so the number of diodes can be reduced as compared with the prior art in which the diode is provided for each third coil. Accordingly, the circuit structure can be simplified and the manufacturing cost can be reduced.

Embodiment 10

Figure 11:
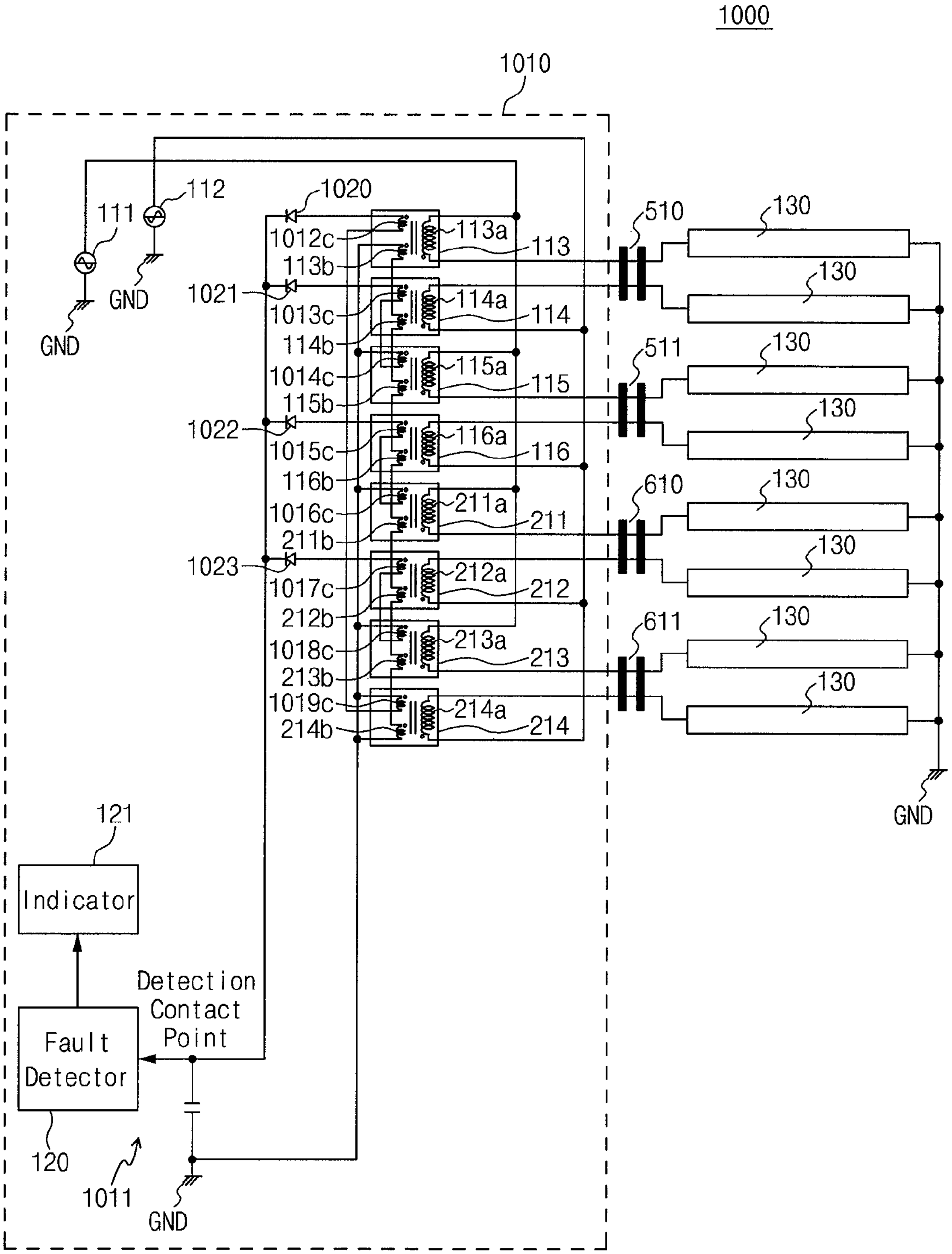
FIG. 11 is a circuit diagram showing an inverter circuit and a backlight assembly according to a tenth embodiment of the present invention.

Hereinafter, a tenth embodiment of the present invention will be described in detail with reference to accompanying drawings. FIG. 11 is a circuit diagram showing an inverter circuit and a backlight assembly according to the tenth embodiment of the present invention. The same reference numerals will be assigned to the elements identical to the elements shown in the second and sixth embodiments, and detailed description thereof will be omitted in order to avoid redundancy.

As shown in FIG. 11, the backlight assembly 1000 according to the tenth embodiment of the present invention includes the inverter circuit 1010, four pairs of cold cathode fluorescent lamps (discharge tubes) 130, and four lamp connectors 510, 511, 610 and 611.

The inverter circuit 1010 includes two inverters 111 and 112, eight balance transformers 113, 114, 115, 116, 211, 212, 213 and 214 and a fault detection device 1011. That is, the inverter circuit 1010 according to the tenth embodiment of the present invention is identical to the inverter circuit 210 according to the second embodiment of the present invention, except for the structure of the fault detection device 1011.

The fault detection device 1011 detects high voltage abnormal discharge in the inverter circuit 1010, such as corona discharge and arc discharge that are generated when a defect occurs in an insulator provided between a high voltage section and the ground GND. The fault detection device 1011 detects the abnormal operation based on the voltage detection values generated from voltages of the eight balance transformers 113, 114, 115, 116, 211, 212, 213 and 214. The fault detection device 1011 includes third coils 1012_c_, 1013_c_, 1014_c_, 1015_c_, 1016_c_, 1017_c_, 1018_c_ and 1019_c_ added to the eight balance transformers 1113, 114, 115, 116, 211, 212, 213 and 214, four diodes 1020, 1021, 1022, and 1023, a fault detector 120 and an indicator 121.

Among the third coils 1012_c_, 1013_c_, 1014_c_, 1015_c_, 1016_c_, 1017_c_, 1018_c_ and 1019_c_, paired third coils to which AC voltage is induced from primary coils connected to different connectors are serially connected to each other so as to offset AC voltage generated from the paired third coils, and one end of the paired third coils is connected to the secondary coil serial loop. In addition, one end of the paired third coils can be directly connected to the ground GND, other than connected to the ground GND through the secondary coil serial loop.

That is, the paired third coils 1012_c_ and 1019_c_ are serially connected to each other so as to offset AC voltage generated from the paired third coils 1012_c_ and 1019_c_, in which the AC voltage is induced to the paired third coils 1012_c_ and 1019_c_ from the primary coils 113*a* and 214*a* connected to different connectors 510 and 611. One end of the paired third coils 1012*c* and 1019*c* is connected to the ground GND by way of the serial loop of the secondary coils 113*b*, 114*b*, 115*b*, 116*b*, 211*b*, 212*b*, 213*b* and 214*b*.

In addition, the paired third coils 1013*c* and 1014*c* are serially connected to each other so as to offset AC voltage generated from the paired third coils 1013*c* and 1014*c*, in which the AC voltage is induced to the paired third coils 1013*c* and 1014*c* from the primary coils 114*a* and 115*a* connected to different connectors 510 and 511. One end of the paired third coils 1013*c* and 1014*c* is connected to the ground GND by way of the serial loop of the secondary coils 113*b*, 114*b*, 115*b*, 116*b*, 211*b*, 212*b*, 213*b* and 214*b*.

Further, the paired third coils 1015*c* and 1016*c* are serially connected to each other so as to offset AC voltage generated from the paired third coils 1015*c* and 1016*c*, in which the AC voltage is induced to the paired third coils 1015*c* and 1016*c* from the primary coils 116*a* and 211*a* connected to different connectors 511 and 610. One end of the paired third coils 1015*c* and 1016*c* is connected to the ground GND by way of the serial loop of the secondary coils 113*b*, 114*b*, 115*b*, 116*b*, 211*b*, 212*b*, 213*b* and 214*b*.

Furthermore, the paired third coils 1017*c* and 1018*c* are serially connected to each other so as to offset AC voltage generated from the paired third coils 1017*c* and 1018*c*, in which the AC voltage is induced to the paired third coils 1017*c* and 1018*c* from the primary coils 212*a* and 213*a* connected to different connectors 610 and 611. One end of the paired third coils 1017*c* and 1018*c* is connected to the ground GND by way of the serial loop of the secondary coils 113*b*, 114*b*, 115*b*, 116*b*, 211*b*, 212*b*, 213*b* and 214*b*.

Input terminals of the diodes 1020, 1021, 1022 and 1023 are connected to one end of the paired third coils so as to detect ripple voltage generated from the paired third coils and then produce the voltage detection value.

That is, the input terminal of the diode 1020 is connected to one end of the paired third coils 1012*c* and 1019, to which the AC voltage is induced from the primary coils 113*a* and 214*a* connected to different connectors 510 and 611, in order to produce the voltage detection value by detecting the ripple voltage generated from the paired third coils 1012*c* and 1019*c*.

In addition, the input terminal of the diode 1021 is connected to one end of the paired third coils 1013*c* and 1014*c*, to which the AC voltage is induced from the primary coils 114*a* and 115*a* connected to different connectors 510 and 511, in order to produce the voltage detection value by detecting the ripple voltage generated from the paired third coils 1013*c* and 1014*c*.

Further, the input terminal of the diode 1022 is connected to one end of the paired third coils 1015*c* and 1016*c*, to which the AC voltage is induced from the primary coils 116*a* and 211*a* connected to different connectors 511 and 610, in order to produce the voltage detection value by detecting the ripple voltage generated from the paired third coils 1015*c* and 1016*c*.

Furthermore, the input terminal of the diode 1023 is connected to one end of the paired third coils 1017*c* and 1018*c*, to which the AC voltage is induced from the primary coils 212*a* and 213*a* connected to different connectors 610 and 611, in order to produce the voltage detection value by detecting the ripple voltage generated from the paired third coils 1017*c* and 1018*c*.

The fault detector 120 is connected to output terminals of the four diodes 1020, 1021, 1022 and 1023. The fault detector 120 compares the voltage detection value generated from voltage of the diodes 1020, 1021, 1022 and 1023 with the predetermined threshold value so as to detect the fault and generates the comparison result. The comparison result is output by the indicator 121.

Embodiment 11

Figure 12:
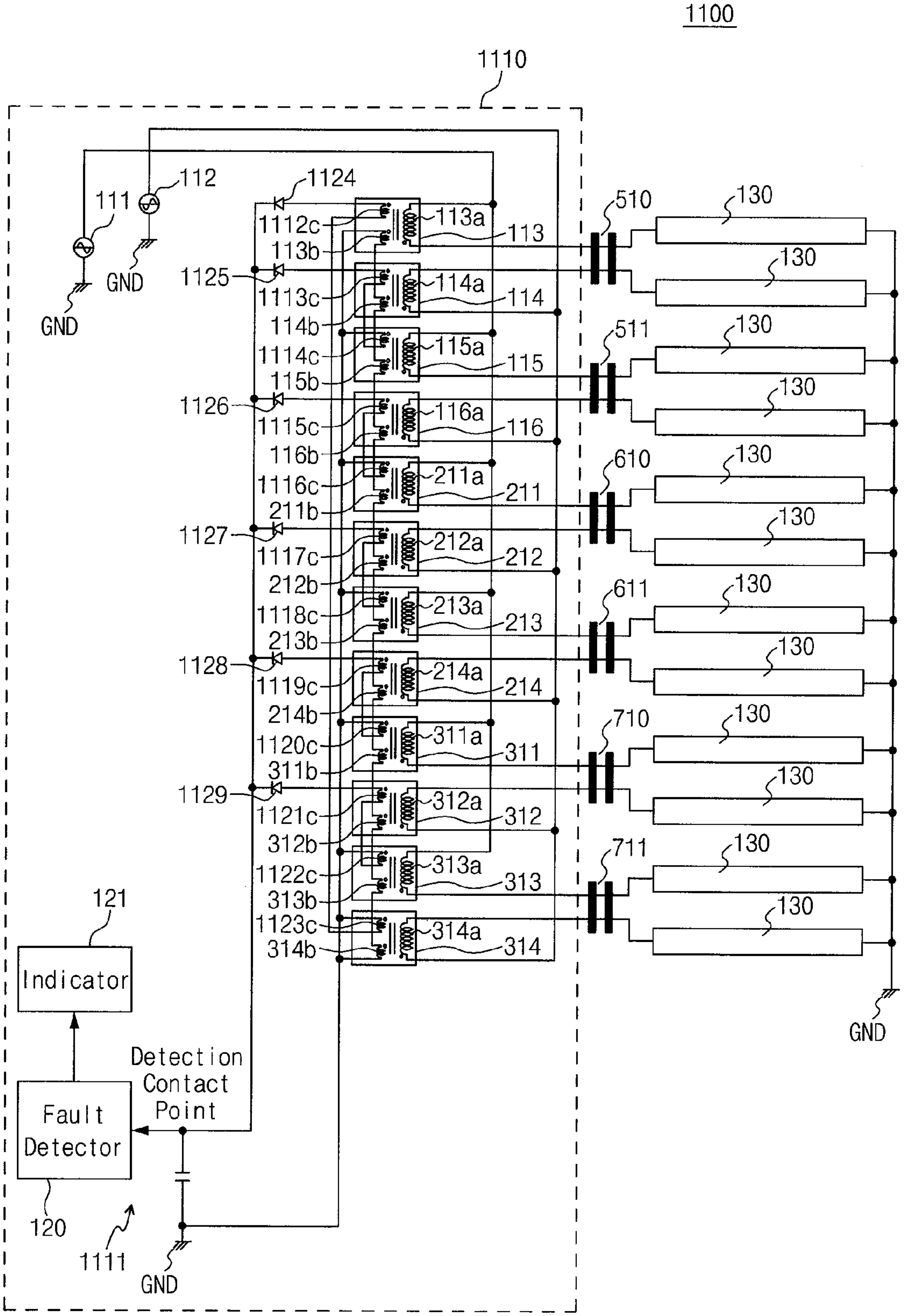
FIG. 12 is a circuit diagram showing an inverter circuit and a backlight assembly according to an eleventh embodiment of the present invention.

Hereinafter, an eleventh embodiment of the present invention will be described in detail with reference to accompanying drawings. FIG. 12 is a circuit diagram showing an inverter circuit and a backlight assembly according to the eleventh embodiment of the present invention. The same reference numerals will be assigned to the elements identical to the elements shown in the third and seventh embodiments, and detailed description thereof will be omitted in order to avoid redundancy.

As shown in FIG. 12, the backlight assembly 1100 according to the eleventh embodiment of the present invention includes the inverter circuit 1110, six pairs of cold cathode fluorescent lamps (discharge tubes) 130, and six lamp connectors 510, 511, 610, 611, 710 and 711.

The inverter circuit 1110 includes two inverters 111 and 112, twelve balance transformers 113, 114, 115, 116, 211, 212, 213, 214, 311, 312, 313 and 314 and a fault detection device 1111. That is, the inverter circuit 1110 according to the eleventh embodiment of the present invention is identical to the inverter circuit 310 according to the third embodiment of the present invention, except for the structure of the fault detection device 1111.

The fault detection device 1111 detects high voltage abnormal discharge in the inverter circuit 1110, such as corona discharge and arc discharge that are generated when a defect occurs in an insulator provided between a high voltage section and the ground GND. The fault detection device 1111 detects the abnormal operation based on the voltage detection values generated from voltages of the twelve balance transformers 113, 114, 115, 116, 211, 212, 213, 214, 311, 312, 313 and 314.

The fault detection device 1111 includes third coils 1112*c*, 1113*c*, 1114*c*, 1115*c*, 1116*c*, 1117*c*, 1118*c*, 1119*c*, 1120*c*, 1121*c*, 1122*c* and 1123*c* added to the twelve balance transformers 113, 114, 115, 116, 211, 212, 213, 214, 311, 312, 313 and 314, six diodes 1124, 1125, 1126, 1127, 1128 and 1129, a fault detector 120 and an indicator 121. Among the third coils 1112*c*, 1113*c*, 1114*c*, 1115*c*, 1116*c*, 1117*c*, 1118*c*, 1119*c*, 1120*c*, 1121*c*, 1122*c* and 1123*c*, paired third coils to which AC voltage is induced from primary coils connected to different connectors are serially connected to each other so as to offset AC voltage generated from the paired third coils, and one end of the paired third coils is connected to the secondary coil serial loop. In addition, one end of the paired third coils can be directly connected to the ground GND, rather than being connected to the ground GND through the secondary coil serial loop.

That is, the paired third coils 1112*c* and 1123*c* are serially connected to each other so as to offset AC voltage generated from the paired third coils 1112*c* and 1123*c*, in which the AC voltage is induced to the paired third coils 1112*c* and 1123*c* from the primary coils 113*a* and 314*a* connected to different connectors 510 and 711. One end of the paired third coils 1112*c* and 1123*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

In addition, the paired third coils 1113*c* and 1114*c* are serially connected to each other so as to offset AC voltage generated from the paired third coils 1113*c* and 1114*c*, in which the AC voltage is induced to the paired third coils 1113c and 1114c from the primary coils 114a and 115a connected to different connectors 510 and 511. One end of the paired third coils 1113c and 1114c is connected to the ground GND by way of the serial loop of the secondary coils 113b, 114b, 115b, 116b, 211b, 212b, 213b, 214b, 311b, 312b, 313b and 314b.

Further, the paired third coils 1115c and 1116c are serially connected to each other so as to offset AC voltage generated from the paired third coils 1115c and 1116c, in which the AC voltage is induced to the paired third coils 1115c and 1116c from the primary coils 116a and 211a connected to different connectors 511 and 610. One end of the paired third coils 1115c and 1116c is connected to the ground GND by way of the serial loop of the secondary coils 113b, 114b, 115b, 116b, 211b, 212b, 213b, 214b, 311b, 312b, 313b and 314b.

Furthermore, the paired third coils 1117c and 1118c are serially connected to each other so as to offset AC voltage generated from the paired third coils 1117c and 1118c, in which the AC voltage is induced to the paired third coils 1117c and 1118c from the primary coils 212a and 213a connected to different connectors 610 and 611. One end of the paired third coils 1117c and 1118c is connected to the ground GND by way of the serial loop of the secondary coils 113b, 114b, 115b, 116b, 211b, 212b, 213b, 214b, 311b, 312b, 313b and 314b.

In addition, the paired third coils 1119c and 1120c are serially connected to each other so as to offset AC voltage generated from the paired third coils 1119c and 1120c, in which the AC voltage is induced to the paired third coils 1119c and 1120c from the primary coils 214a and 311a connected to different connectors 611 and 710. One end of the paired third coils 1119c and 1120c is connected to the ground GND by way of the serial loop of the secondary coils 113b, 114b, 115b, 116b, 211b, 212b, 213b, 214b, 311b, 312b, 313b and 314b.

Further, the paired third coils 1121c and 1122c are serially connected to each other so as to offset AC voltage generated from the paired third coils 1121c and 1122c, in which the AC voltage is induced to the paired third coils 1121c and 1122c from the primary coils 312a and 313a connected to different connectors 710 and 711. One end of the paired third coils 1121c and 1122c is connected to the ground GND by way of the serial loop of the secondary coils 113b, 114b, 115b, 116b, 211b, 212b, 213b, 214b, 311b, 312b, 313b and 314b.

Input terminals of the diodes 1124, 1125, 1126, 1127, 1128 and 1129 are connected to one end of the paired third coils so as to detect ripple voltage generated from the paired third coils and so as to produce the voltage detection value.

That is, the input terminal of the diode 1124 is connected to one end of the paired third coils 1112c and 1123c, to which the AC voltage is induced from the primary coils 113a and 314a connected to different connectors 510 and 711, in order to produce the voltage detection value by detecting the ripple voltage generated from the paired third coils 1112c and 1123c.

In addition, the input terminal of the diode 1125 is connected to one end of the paired third coils 1113c and 1114c, to which the AC voltage is induced from the primary coils 114a and 115a connected to different connectors 510 and 511, in order to produce the voltage detection value by detecting the ripple voltage generated from the paired third coils 1113c and 1114c.

Further, the input terminal of the diode 1126 is connected to one end of the paired third coils 1115c and 1116c, to which the AC voltage is induced from the primary coils 116a and 211a connected to different connectors 511 and 610, in order to produce the voltage detection value by detecting the ripple voltage generated from the paired third coils 1115c and 1116c.

Furthermore, the input terminal of the diode 1127 is connected to one end of the paired third coils 1117c and 1118c, to which the AC voltage is induced from the primary coils 212a and 213a connected to different connectors 610 and 611, in order to produce the voltage detection value by detecting the ripple voltage generated from the paired third coils 1117c and 1118c.

The input terminal of the diode 1128 is connected to one end of the paired third coils 1119c and 1120c, to which the AC voltage is induced from the primary coils 214a and 311a connected to different connectors 611 and 710, in order to produce the voltage detection value by detecting the ripple voltage generated from the paired third coils 1119c and 1120c.

In addition, the input terminal of the diode 1129 is connected to one end of the paired third coils 1121c and 1122c, to which the AC voltage is induced from the primary coils 312a and 313a connected to different connectors 710 and 711, in order to produce the voltage detection value by detecting the ripple voltage generated from the paired third coils 1121c and 1122c.

The fault detector 120 is connected to output terminals of the six diodes 1124, 1125, 1126, 1127, 1128 and 1129. The fault detector 120 compares the voltage detection value generated from voltage of the diodes 1124, 1125, 1126, 1127, 1128 and 1129 with the predetermined threshold value so as to detect the fault and generates the comparison result. The comparison result is output by the indicator 121.

Embodiment 12

Figure 13:
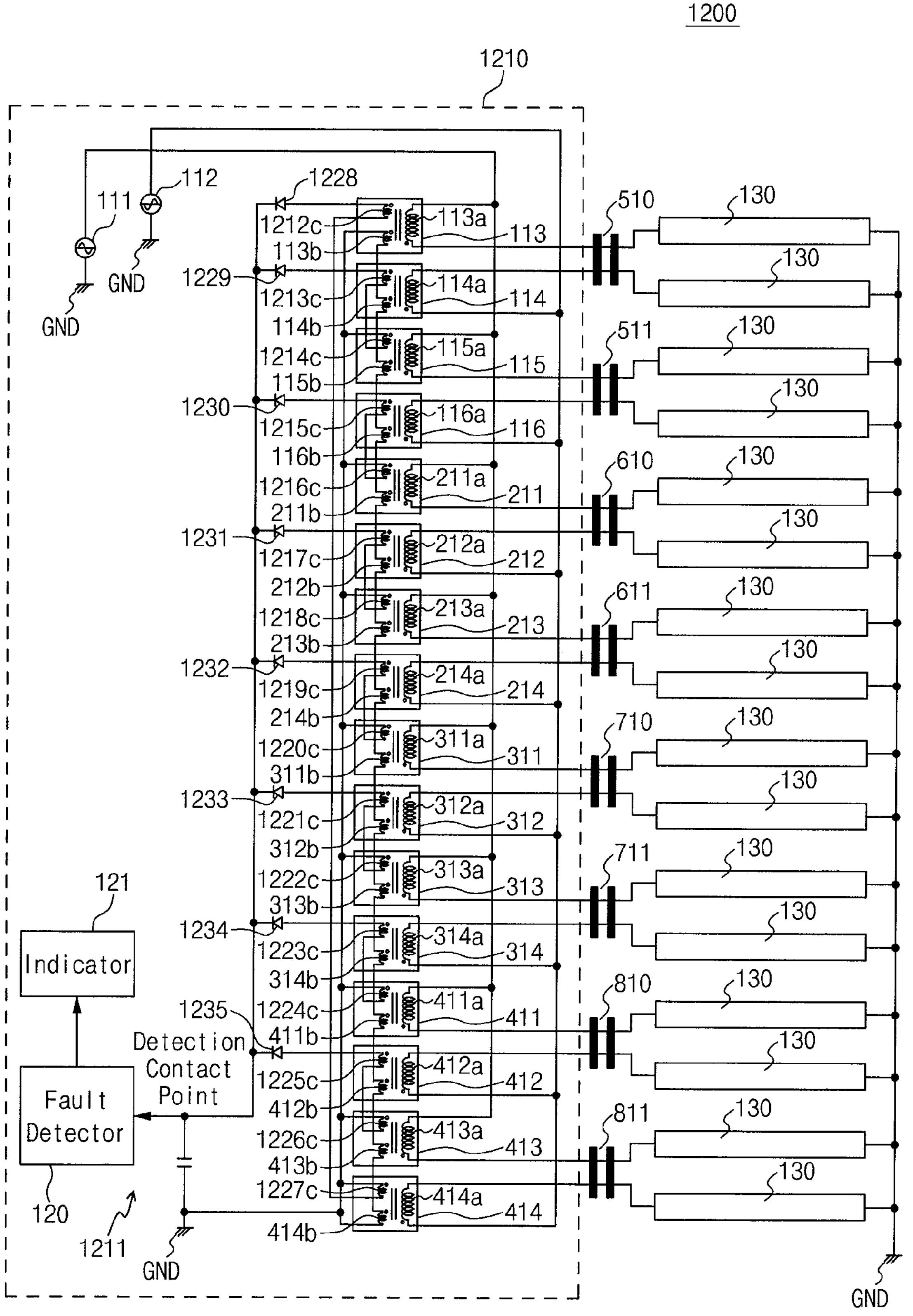
FIG. 13 is a circuit diagram showing an inverter circuit and a backlight assembly according to a twelfth embodiment of the present invention.

Hereinafter, a twelfth embodiment of the present invention will be described in detail with reference to accompanying drawings. FIG. 13 is a circuit diagram showing an inverter circuit and a backlight assembly according to the twelfth embodiment of the present invention. The same reference numerals will be assigned to the elements identical to the elements shown in the fourth and eighth embodiments, and detailed description thereof will be omitted in order to avoid redundancy.

As shown in FIG. 13, the backlight assembly 1100 according to the twelfth embodiment of the present invention includes the inverter circuit 1210, eight pairs of cold cathode fluorescent lamps (discharge tubes) 130, and eight lamp connectors 510, 511, 610, 611, 710, 711, 810 and 811.

The inverter circuit 1210 includes two inverters 111 and 112, sixteen balance transformers 113, 114, 115, 116, 211, 212, 213, 214, 311, 312, 313, 314, 411, 412, 413 and 414, and a fault detection device 1211. That is, the inverter circuit 1210 according to the twelfth embodiment of the present invention is identical to the inverter circuit 410 according to the fourth embodiment of the present invention, except for the structure of the fault detection device 1211.

The fault detection device 1211 detects high voltage abnormal discharge in the inverter circuit 1210, such as corona discharge and arc discharge, which are generated when a defect occurs in an insulator provided between a high voltage section and the ground GND. The fault detection device 1211 detects the abnormal operation based on the voltage detection values of voltages generated from the sixteen balance transformers 113, 114, 115, 116, 211, 212, 213, 214, 311, 312, 313, 314, 411, 412, 413, and 414.

The fault detection device 1211 includes third coils 1212c, 1213c, 1214c, 1215c, 1216c, 1217c, 1218c, 1219c, 1220c,

1221*c*, 1222*c*, 1223*c*, 1224*c*, 1225*c*, 1226*c* and 1227*c* added to the sixteen balance transformers 1113, 114, 115, 116, 211, 212, 213, 214, 311, 312, 313, 314, 411, 412, 413 and 414, eight diodes 1228, 1229, 1230, 1231, 1232, 1233, 1234 and 1235, a fault detector 120 and an indicator 121.

Among the third coils 1212*c*, 1213*c*, 1214*c*, 1215*c*, 1216*c*, 1217*c*, 1218*c*, 1219*c*, 1220*c*, 1221*c*, 1222*c*, 1223*c*, 1224*c*, 1225*c*, 1226*c* and 1227*c*, paired third coils to which AC voltage is induced from primary coils connected to different connectors are serially connected to each other so as to offset AC voltage generated from the paired third coils, and one end of the paired third coils is connected to the secondary coil serial loop. In addition, one end of the paired third coils can be directly connected to the ground GND, other than connected to the ground GND through the secondary coil serial loop.

That is, the paired third coils 1212*c* and 1227*c* are serially connected to each other so as to offset AC voltage generated from the paired third coils 1212*c* and 1227*c*, in which the AC voltage is induced to the paired third coils 1212*c* and 1227*c* from the primary coils 113*a* and 414*a* connected to different connectors 510 and 811. One end of the paired third coils 1212*c* and 1227*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

The paired third coils 1213*c* and 1214*c* are serially connected to each other so as to offset AC voltage generated from the paired third coils 1213*c* and 1214*c*, in which the AC voltage is induced to the paired third coils 1213*c* and 1214*c* from the primary coils 114*a* and 115*a* connected to different connectors 510 and 511. One end of the paired third coils 1213*c* and 1214*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

The paired third coils 1215*c* and 1216*c* are serially connected to each other so as to offset AC voltage generated from the paired third coils 1215*c* and 1216*c*, in which the AC voltage is induced to the paired third coils 1215*c* and 1216*c* from the primary coils 116*a* and 211*a* connected to different connectors 511 and 610. One end of the paired third coils 1215*c* and 1216*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

The paired third coils 1217*c* and 1218*c* are serially connected to each other so as to offset AC voltage generated from the paired third coils 1217*c* and 1218*c*, in which the AC voltage is induced to the paired third coils 1217*c* and 1218*c* from the primary coils 212*a* and 213*a* connected to different connectors 610 and 611. One end of the paired third coils 1217*c* and 1218*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

The paired third coils 1219*c* and 1220*c* are serially connected to each other so as to offset AC voltage generated from the paired third coils 1219*c* and 1220*c*, in which the AC voltage is induced to the paired third coils 1219*c* and 1220*c* from the primary coils 214*a* and 311*a* connected to different connectors 611 and 710. One end of the paired third coils 1219*c* and 1220*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

The paired third coils 1221*c* and 1222*c* are serially connected to each other so as to offset AC voltage generated from the paired third coils 1221*c* and 1222*c*, in which the AC voltage is induced to the paired third coils 1221*c* and 1222*c* from the primary coils 312*a* and 313*a* connected to different connectors 710 and 711. One end of the paired third coils 1221*c* and 1222*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

The paired third coils 1223*c* and 1224*c* are serially connected to each other so as to offset AC voltage generated from the paired third coils 1223*c* and 1224*c*, in which the AC voltage is induced to the paired third coils 1223*c* and 1224*c* from the primary coils 314*a* and 411*a* connected to different connectors 711 and 810. One end of the paired third coils 1223*c* and 1224*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

The paired third coils 1225*c* and 1226*c* are serially connected to each other so as to offset AC voltage generated from the paired third coils 1225*c* and 1226*c*, in which the AC voltage is induced to the paired third coils 1225*c* and 1226*c* from the primary coils 412*a* and 413*a* connected to different connectors 810 and 811. One end of the paired third coils 1225*c* and 1226*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

Input terminals of the diodes 1228, 1229, 1230, 1231, 1232, 1233, 1234 and 1235 are connected to one end of the paired third coils so as to detect ripple voltage generated from the paired third coils and then produce the voltage detection value.

That is, the input terminal of the diode 1228 is connected to one end of the paired third coils 1212*c* and 1227*c*, to which the AC voltage is induced from the primary coils 113*a* and 414*a* connected to different connectors 510 and 811, in order to produce the voltage detection value by detecting the ripple voltage generated from the paired third coils 1212*c* and 1227*c*.

The input terminal of the diode 1229 is connected to one end of the paired third coils 1213*c* and 1214*c*, to which the AC voltage is induced from the primary coils 114*a* and 115*a* connected to different connectors 510 and 511, in order to produce the voltage detection value by detecting the ripple voltage generated from the paired third coils 1213*c* and 1214*c*.

The input terminal of the diode 1230 is connected to one end of the paired third coils 1215*c* and 1216*c*, to which the AC voltage is induced from the primary coils 116*a* and 211*a* connected to different connectors 511 and 610, in order to produce the voltage detection value by detecting the ripple voltage generated from the paired third coils 1215*c* and 1216*c*.

The input terminal of the diode 1231 is connected to one end of the paired third coils 1217*c* and 1218*c*, to which the AC voltage is induced from the primary coils 212*a* and 213*a* connected to different connectors 610 and 611, in order to produce the voltage detection value by detecting the ripple voltage generated from the paired third coils 1217*c* and 1218*c*.

The input terminal of the diode 1232 is connected to one end of the paired third coils 1219*c* and 1220*c*, to which the AC voltage is induced from the primary coils 214*a* and 311*a* connected to different connectors 611 and 710, in order to produce the voltage detection value by detecting the ripple voltage generated from the paired third coils 1219*c* and 1220*c*.

The input terminal of the diode 1233 is connected to one end of the paired third coils 1221*c* and 1222*c*, to which the AC voltage is induced from the primary coils 312*a* and 313*a* connected to different connectors 710 and 711, in order to produce the voltage detection value by detecting the ripple voltage generated from the paired third coils 1221*c* and 1222*c*.

The input terminal of the diode 1234 is connected to one end of the paired third coils 1223*c* and 1224*c*, to which the AC voltage is induced from the primary coils 314*a* and 411*a* connected to different connectors 711 and 810, in order to produce the voltage detection value by detecting the ripple voltage generated from the paired third coils 1223*c* and 1224*c*.

The input terminal of the diode 1235 is connected to one end of the paired third coils 1225*c* and 1226*c*, to which the AC voltage is induced from the primary coils 412*a* and 413*a* connected to different connectors 810 and 811, in order to produce the voltage detection value by detecting the ripple voltage generated from the paired third coils 1225*c* and 1226*c*.

The fault detector 120 is connected to output terminals of the eight diodes 1228, 1229, 1230, 1231, 1232, 1233, 1234 and 1235. The fault detector 120 compares the voltage detection value generated from voltage of the diodes 1228, 1229, 1230, 1231, 1232, 1233, 1234 and 1235 with the predetermined threshold value so as to detect the fault and generates the comparison result. The comparison result is output by the indicator 121.

Embodiment 13

Figure 14:
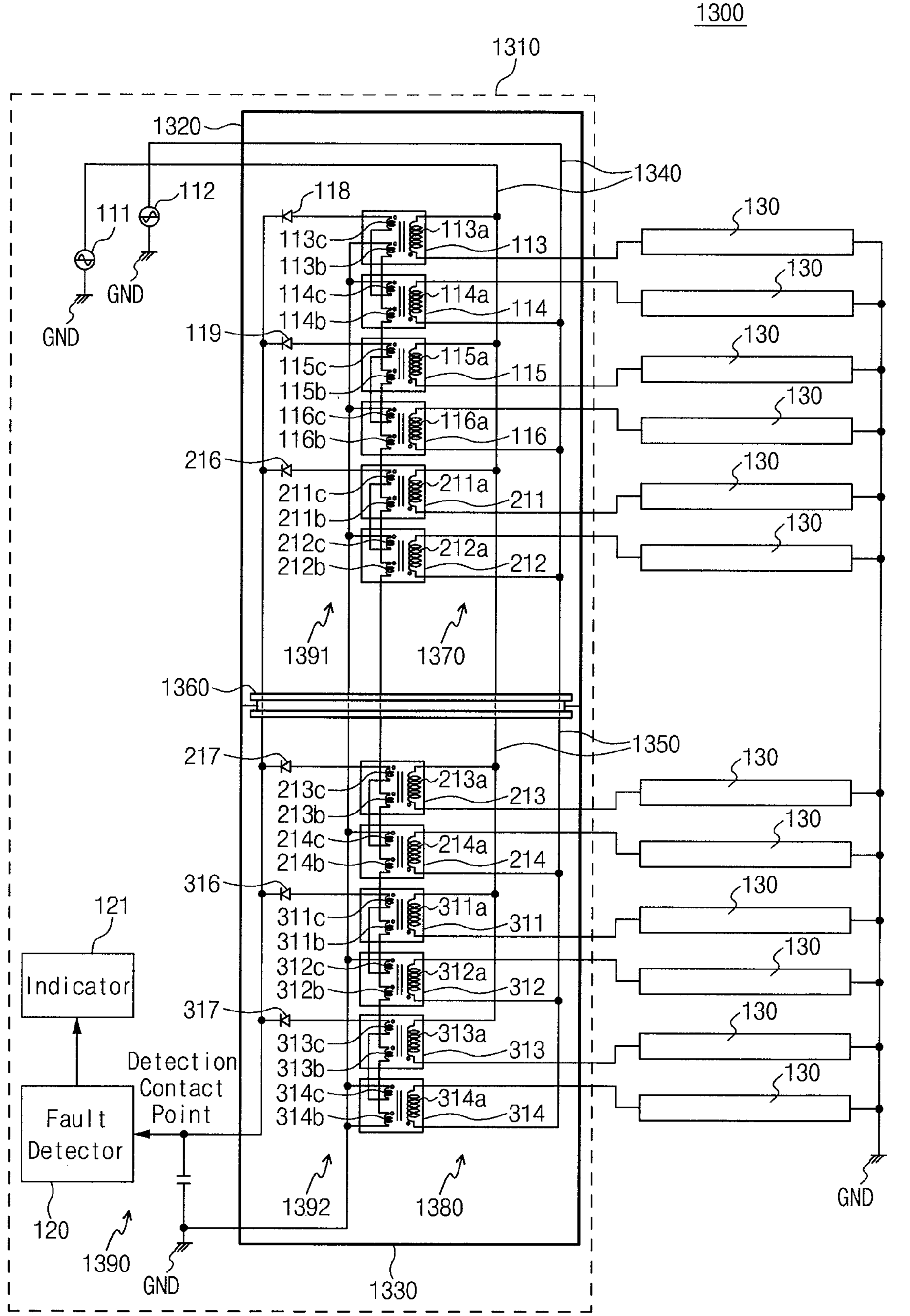
FIG. 14 is a circuit diagram showing an inverter circuit and a backlight assembly according to a thirteenth embodiment of the present invention.

Hereinafter, a thirteenth embodiment of the present invention will be described in detail with reference to accompanying drawings. FIG. 14 is a circuit diagram showing an inverter circuit and a backlight assembly according to the thirteenth embodiment of the present invention. The same reference numerals will be assigned to the elements identical to the elements shown in the third embodiment, and detailed description thereof will be omitted in order to avoid redundancy.

As shown in FIG. 14, the backlight assembly 1300 according to the thirteenth embodiment of the present invention includes the inverter circuit 1310, and six pairs of cold cathode fluorescent lamps (discharge tubes) 130.

The inverter circuit 1310 includes two inverters 111 and 112, a first substrate 1320, a second substrate 1330, a first power supply line 1340 mounted on the first substrate 1320, a second power supply line 1350 mounted on the second substrate 1330, a connector 1360 that interconnects the substrates, first group balance transformers 1370 mounted on the first substrate 1320, second group balance transforms 1380 mounted on the second substrate 1330, and a fault detection device 1390.

The first power supply line 1340 is connected to output terminals of the inverters 111 and 112 and input terminals of the first group balance transformers 1370. The first group balance transformers 1370 are connected to three pairs of cold cathode fluorescent lamps 130. In addition, the inverters 111 and 112 provide power to the three pairs of cold cathode fluorescent lamps 130 through the first power supply line 1340 and the first group balance transformers 1370.

The second power supply line 1350 is connected to output terminals of the inverters 111 and 112 and input terminals of the second group balance transformers 1380. The second group balance transformers 1380 are connected to three pairs of cold cathode fluorescent lamps 130. In addition, the inverters 111 and 112 provide power to the three pairs of cold cathode fluorescent lamps 130 through the second power supply line 1350 and the second group balance transformers 1380.

The connector 1360 electrically connects the first power supply line 1340 to the second power supply line 1350. In addition, the connector 1360 electrically connects the first group balance transformers 1370 to the second group balance transformers 1380. Further, the connector 1360 electrically connects a first fault detection unit 1391 of the fault detection device 1390 to a second fault detection unit 1392 of the fault detection device 1390.

The first group balance transformers 1370 include six balance transformers 113, 114, 115, 116, 211 and 212. The six balance transformers 113, 114, 115, 116, 211 and 212 have primary coils 113*a*, 114*a*, 115*a*, 116*a*, 211*a* and 212*a*, which are connected between the first power supply line 1340 and three pairs of cold cathode fluorescent lamps 130, respectively. The six balance transformers 113, 114, 115, 116, 211 and 212 have secondary coils 113*b*, 114*b*, 115*b*, 116*b*, 211*b* and 212*b*, to which AC voltage is induced from the primary coils 113*a*, 114*a*, 115*a*, 116*a*, 211*a* and 212*a*, respectively. Among the secondary coils 113*b*, 114*b*, 115*b*, 116*b*, 211*b* and 212*b*, adjacent secondary coils are serially connected to each other.

The second group balance transformers 1380 include six balance transformers 213, 214, 311, 312, 313 and 314. The six balance transformers 213, 214, 311, 312, 313 and 314 have primary coils 213*a*, 214*a*, 311*a*, 312*a*, 313*a* and 314*a*, which are connected between the second power supply line 1350 and three pairs of cold cathode fluorescent lamps 130, respectively. The six balance transformers 213, 214, 311, 312, 313 and 314 have secondary coils 213*b*, 214*b*, 311*b*, 312*b*, 313*b* and 314*b*, to which AC voltage is induced from the primary coils 213*a*, 214*a*, 311*a*, 312*a*, 313*a* and 314*a*, respectively. Among the secondary coils 213*b*, 214*b*, 311*b*, 312*b*, 313*b* and 314*b*, adjacent secondary coils are serially connected to each other.

In addition, the secondary coils of the first and second group balance transformers 1370 and 1380 are connected to the connector 1360 to form the secondary coil serial loop. A part of the secondary coil serial loop is connected to the ground GND. That is, six secondary coils 113*b*, 114*b*, 115*b*, 116*b*, 211*b* and 212*b* of the first group balance transformers 1370 are connected to the connector 1360 so as to form the secondary coil serial loop together with the six secondary coils 213*b*, 214*b*, 311*b*, 312*b*, 313*b* and 314*b* of the second group balance transformers 1380, and the second coil serial loop is partially connected to the ground GND.

The fault detection device 1390 detects high voltage abnormal discharge in the inverter circuit 1310, such as corona discharge and arc discharge, which are generated when a defect occurs in an insulator provided between a high voltage section and the ground GND. The fault detection device 1390 detects the abnormal operation based on the voltage detection values generated from voltages of the first and second group balance transformers 1370 and 1380.

The fault detection device 1390 includes the first fault detection unit 1391, the second fault detection unit 1392, a fault detector 120 and an indicator 121.

The first fault detection unit 1391 includes three pairs of third coils 113*c*, 114*c*, 115*c*, 116*c*, 211*c*, and 212*c* and three diodes 118, 119 and 216.

Among the third coils 113*c*, 114*c*, 115*c*, 116*c*, 211*c*, and 212*c* of the first fault detection unit 1391, adjacent third coils, which are aligned as a pair, are serially connected to each other so as to offset AC voltage generated from the paired third coils, and one end of the paired third coils is connected to the secondary coil serial loop. In addition, one end of the paired third coils can be directly connected to the ground GND, other than connected to the ground GND through the secondary coil serial loop.

That is, the paired third coils 113*c* and 114*c* adjacent to each other are serially connected to each other so as to offset AC voltage generated from the paired third coils 113*c* and 114*c*, and one end of the paired third coils 113*c* and 114*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

In addition, the paired third coils 115*c* and 116*c* adjacent to each other are serially connected to each other so as to offset AC voltage generated from the paired third coils 115*c* and 116*c*, and one end of the paired third coils 115*c* and 116*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

Further, the paired third coils 211*c* and 212*c* adjacent to each other are serially connected to each other so as to offset AC voltage generated from the paired third coils 211*c* and 212*c*, and one end of the paired third coils 211*c* and 212*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

The second fault detection unit 1392 includes three pairs of third coils 213*c*, 214*c*, 311*c*, 312*c*, 313*c*, and 314*c* and three diodes 217, 316 and 317.

Among the third coils 213*c*, 214*c*, 311*c*, 312*c*, 313*c*, and 314*c* of the second fault detection unit 1392, paired third coils adjacent to each other are serially connected to each other so as to offset AC voltage generated from the paired third coils, and one end of the paired third coils is connected to the secondary coil serial loop. In addition, one end of the paired third coils can be directly connected to the ground GND, other than connected to the ground GND through the secondary coil serial loop.

That is, the paired third coils 213*c* and 214*c* adjacent to each other are serially connected to each other so as to offset AC voltage generated from the paired third coils 213*c* and 214*c*, and one end of the paired third coils 213*c* and 214*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

In addition, the paired third coils 311*c* and 312*c* adjacent to each other are serially connected to each other so as to offset AC voltage generated from the paired third coils 311*c* and 312*c*, and one end of the paired third coils 311*c* and 312*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

Further, the paired third coils 313*c* and 314*c* adjacent to each other are serially connected to each other so as to offset AC voltage generated from the paired third coils 313*c* and 314*c*, and one end of the paired third coils 313*c* and 314*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

In this manner, the third coils of the first fault detection unit 1391 are connected to the third coils of the second fault detection unit 1392 by means of the connector 1360, and one end of the third coils of the first and second fault detection units 1391 and 1392 can be connected to the ground through the secondary coil serial loop.

Input terminals of the diodes 118, 119 and 216 of the first fault detection unit 1391 are connected to one end of the paired third coils so as to detect ripple voltage generated from the paired third coils and then produce the voltage detection value.

That is, the input terminal of the diode 118 is connected to one end of the paired third coils 113*c* and 114*c* in order to produce the voltage detection value by detecting the ripple voltage generated from the paired third coils 113*c* and 114*c*.

The input terminal of the diode 119 is connected to the paired third coils 115*c* and 116*c* in order to produce the voltage detection value by detecting the ripple voltage generated from the paired third coils 115*c* and 116*c*.

The input terminal of the diode 216 is connected to the paired third coils 211*c* and 212*c* in order to produce the voltage detection value by detecting the ripple voltage generated from the paired third coils 211*c* and 212*c*.

In addition, input terminals of the diodes 217, 316 and 317 of the second fault detection unit 1392 are connected to one end of the paired third coils so as to detect ripple voltage generated from the paired third coils and then produce the voltage detection value.

That is, the input terminal of the diode 217 is connected to one end of the paired third coils 213*c* and 214*c* in order to produce the voltage detection value by detecting the ripple voltage generated from the paired third coils 213*c* and 214*c*.

The input terminal of the diode 316 is connected to the paired third coils 311*c* and 312*c* in order to produce the voltage detection value by detecting the ripple voltage generated from the paired third coils 311*c* and 312*c*.

The input terminal of the diode 317 is connected to the paired third coils 313*c* and 314*c* in order to produce the voltage detection value by detecting the ripple voltage generated from the paired third coils 313*c* and 314*c*.

The fault detector 120 is connected to output terminals of the diodes 118, 119 and 216 of the first fault detection unit 1391 and output terminals of the diodes 217, 316 and 317 of the second fault detection unit 1392. The fault detector 120 compares the voltage detection value generated from voltage of the diodes 118, 119, 216, 217, 316 and 317 with the predetermined threshold value so as to detect the fault and generates the comparison result. As described above, according to the thirteenth embodiment of the present invention, the connector for interconnecting the substrates electrically connects the first and second power supply lines, the first and second substrates, the first and second group balance transforms and the first and second fault detection units. In addition, among the plural third coils of each fault detection unit, the paired third coils adjacent to each other are serially connected to each other through the connector so as to offset the AC voltage generated from the paired third coils and one end of the paired third coils is connected to input terminals of the plural diodes. Thus, according to the thirteenth embodiment of the present invention, the backlight assembly can be fabricated in a large size without increasing the number of connector terminals interposed between substrates. Further, according to the thirteenth embodiment of the present invention, even if the number of the cold cathode fluorescent lamps increases due to the large-size backlight assembly, since the paired third coils adjacent to each other are serially connected to each other in each substrate so as to offset the AC voltage generated from the paired third coils, the abnormal operation of the backlight assembly can be more precisely detected.

Embodiment 14

Figure 15:
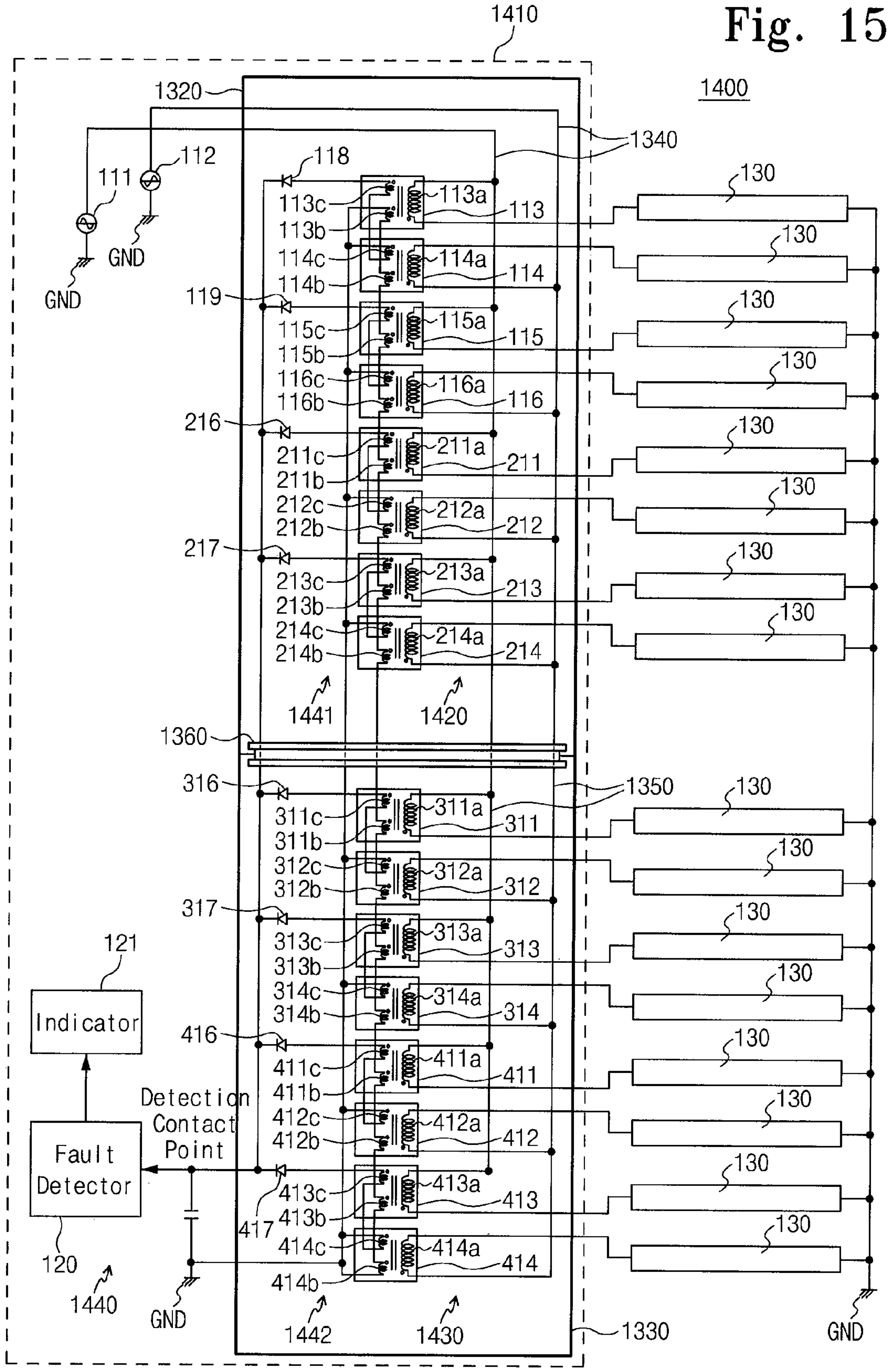
FIG. 15 is a circuit diagram showing an inverter circuit and a backlight assembly according to a fourteenth embodiment of the present invention.

Hereinafter, a fourteenth embodiment of the present invention will be described in detail with reference to accompanying drawings. FIG. 15 is a circuit diagram showing an inverter circuit and a backlight assembly according to the fourteenth embodiment of the present invention. The same reference numerals will be assigned to the elements identical to the elements shown in the fourth and thirteenth embodiments, and detailed description thereof will be omitted in order to avoid redundancy.

As shown in FIG. 15, the backlight assembly 1400 according to the fourteenth embodiment of the present invention includes the inverter circuit 1410, and eight pairs of cold cathode fluorescent lamps (discharge tubes) 130.

The inverter circuit 1410 includes two inverters 111 and 112, a first substrate 1320, a second substrate 1330, a first power supply line 1340 mounted on the first substrate 1320, a second power supply line 1350 mounted on the second substrate 1330, a connector 1360 that interconnects the substrates, first group balance transformers 1420 mounted on the first substrate 1320, second group balance transforms 1430 mounted on the second substrate 1330, and a fault detection device 1440. That is, the inverter circuit 1410 according to the fourteenth embodiment of the present invention is identical to the inverter circuit 1310 according to the thirteenth embodiment of the present invention, except for the structure of the first and second group balance transformers 1420 and 1430 and the fault detection device 1440.

The connector 1360 electrically connects the first group balance transformers 1420 to the second group balance transformers 1430. In addition, the connector 1360 electrically connects a first fault detection unit 1441 of the fault detection device 1440 to a second fault detection unit 1442 of the fault detection device 1440.

The first group balance transformers 1420 include eight balance transformers 113, 114, 115, 116, 211, 212, 213 and 214. That is, the first group balance transformers 1420 according to the fourteenth embodiment of the present invention further include two balance transformers 213 and 214 of the second group balance transformers 1380 according to the thirteenth embodiment of the present invention.

The two balance transformers 213 and 214 include primary coils 213*a* and 214*a*, which are connected between the first power supply line 1340 and a pair of cold cathode fluorescent lamps 130, respectively. In addition, the balance transformers 213 and 214 have secondary coils 213*b* and 214*b*, to which AC voltage is induced from the primary coils 213*a* and 214*a*. The secondary coils 213*b* and 214*b* are serially connected to each other.

The second group balance transformers 1430 include eight balance transformers 311, 312, 313, 314, 411, 412, 413 and 414. That is, the second group balance transformers 1430 according to the fourteenth embodiment of the present invention have no two balance transformers 213 and 214 and further include four balance transformers 411, 412, 413 and 414 as compared with the second group balance transformers 1380 according to the thirteenth embodiment of the present invention.

The four balance transformers 411, 412, 413 and 414 include primary coils 411*a*, 412*a*, 413*a* and 414*a*, which are connected between the second power supply line 1350 and two pairs of cold cathode fluorescent lamps 130, respectively. In addition, the four balance transformers 411, 412, 413 and 414 have secondary coils 411*b*, 412*b*, 413*b* and 414*b*, to which AC voltage is induced from the primary coils 411*a*, 412*a*, 413*a* and 414*a*. Among the secondary coils 411*b*, 412*b*, 413*b* and 414*b*, adjacent secondary coils are serially connected to each other.

In addition, sixteen secondary coils of the first and second balance transformers 1420 and 1430 are connected to the connector 1360 to form the serial loop of the secondary coils. A part of the secondary coil serial loop is connected to the ground GND. That is, eight secondary coils 113*b*, 114*b*, 115*b*, 116*b*, 211*b*, 212*b*, 213*b* and 214*b* of the first group balance transformers 1420 are connected to the connector 1360 so as to form the secondary coil serial loop together with the eight secondary coils 311*b*, 312*b*, 313*b*, 314*b*, 411*b*, 412*b*, 413*b* and 414*b* of the second group balance transformers 1430, and the second coil serial loop is partially connected to the ground GND.

The fault detection device 1440 detects high voltage abnormal discharge in the inverter circuit 1410, such as corona discharge and arc discharge, which are generated when a defect occurs in an insulator provided between a high voltage section and the ground GND. The fault detection device 1440 detects the abnormal operation based on the voltage detection values generated from voltages of the first and second group balance transformers 1420 and 1430.

The fault detection device 1440 includes the first fault detection unit 1441, the second fault detection unit 1442, a fault detector 120 and an indicator 121.

The first fault detection unit 1441 includes four pairs of third coils 113*c*, 114*c*, 115*c*, 116*c*, 211*c*, 212*c*, 213*c* and 214*c* and four diodes 118, 119, 216 and 217. That is, the first fault detection unit 1441 further includes a pair of third coils 213*c* and 214*c* and the diode 217 of the second fault detection unit 1392 according to the thirteenth embodiment of the present invention.

Among the third coils 113*c*, 114*c*, 115*c*, 116*c*, 211*c*, 212*c*, 213*c* and 214*c* of the first fault detection unit 1441, adjacent third coils, which are aligned as a pair, are serially connected to each other so as to offset AC voltage generated from the paired third coils, and one end of the paired third coils is connected to the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*. In addition, one end of the paired third coils can be directly connected to the ground GND, other than connected to the ground GND through the secondary coil serial loop.

That is, the paired third coils 213*c* and 214*c* adjacent to each other are serially connected to each other so as to offset AC voltage generated from the paired third coils 213*c* and 214*c*, and one end of the paired third coils 213*c* and 214*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

The second fault detection unit 1442 includes four pairs of third coils 311*c*, 312*c*, 313*c*, 314*c*, 411*c*, 412*c*, 413*c* and 414*c* and four diodes 316, 317, 416 and 417. That is, the second fault detection unit 1442 according to the fourteenth embodiment of the present invention has no third coils 213*c* and 214*c*, and further includes two pairs of third coils 411*c*, 412*c*, 413*c* and 414*c* as compared with the second fault detection unit 1392 according to the thirteenth embodiment of the present invention. In addition, the second fault detection unit 1442 according to the fourteenth embodiment of the present invention has no diode 217, and further includes two diodes 416 and 417 as compared with the second fault detection unit 1392 according to the thirteenth embodiment of the present invention.

Among the third coils 311*c*, 312*c*, 313*c*, 314*c*, 411*c*, 412*c*, 413*c* and 414*c* of the second fault detection unit 1442, adjacent third coils, which are aligned as a pair, are serially connected to each other so as to offset AC voltage generated from the paired third coils, and one end of the paired third coils is connected to the serial loop of the secondary coils 113_b_, 114_b_, 115_b_, 116_b_, 211_b_, 212_b_, 213_b_, 214_b_, 311_b_, 312_b_, 313_b_, 314_b_, 411_b_, 412_b_, 413_b_ and 414_b_. In addition, one end of the paired third coils can be directly connected to the ground GND, other than connected to the ground GND through the secondary coil serial loop.

That is, the paired third coils 411_c_ and 412_c_ adjacent to each other are serially connected to each other so as to offset AC voltage generated from the paired third coils 411_c_ and 412_c_, and one end of the paired third coils 411_c_ and 412_c_ is connected to the ground GND by way of the serial loop of the secondary coils 113_b_, 114_b_, 115_b_, 116_b_, 211_b_, 212_b_, 213_b_, 214_b_, 311_b_, 312_b_, 313_b_, 314_b_, 411_b_, 412_b_, 413_b_ and 414_b_.

In addition, the paired third coils 413_c_ and 414_c_ adjacent to each other are serially connected to each other so as to offset AC voltage generated from the paired third coils 413_c_ and 414_c_, and one end of the paired third coils 411_c_ and 412_c_ is connected to the ground GND by way of the serial loop of the secondary coils 113_b_, 114_b_, 115_b_, 116_b_, 211_b_, 212_b_, 213_b_, 214_b_, 311_b_, 312_b_, 313_b_, 314_b_, 411_b_, 412_b_, 413_b_ and 414_b_.

In this manner, the third coils of the first fault detection unit 1441 are connected to the third coils of the second fault detection unit 1442 by means of the connector 1360, and one end of the third coils of the first and second fault detection units 1441 and 1442 can be connected to the ground through the secondary coil serial loop.

Input terminals of the four diodes 118, 119, 216 and 217 of the first fault detection unit 1441 are connected to one end of the paired third coils so as to detect ripple voltage generated from the paired third coils and then produce the voltage detection value.

That is, the input terminal of the diode 217 is connected to one end of the paired third coils 213_c_ and 214_c_ in order to produce the voltage detection value by detecting the ripple voltage generated from the paired third coils 213_c_ and 214_c_.

In addition, input terminals of the diodes 316, 317, 416 and 417 of the second fault detection unit 1442 are connected to one end of the paired third coils so as to detect ripple voltage generated from the paired third coils and then produce the voltage detection value.

That is, the input terminal of the diode 416 is connected to one end of the paired third coils 411_c_ and 412_c_ in order to produce the voltage detection value by detecting the ripple voltage generated from the paired third coils 411_c_ and 412_c_.

In addition, the input terminal of the diode 417 is connected to the paired third coils 413_c_ and 414_c_ in order to produce the voltage detection value by detecting the ripple voltage generated from the paired third coils 413_c_ and 414_c_.

The fault detector 120 is connected to output terminals of the diodes 118, 119 216 and 217 of the first fault detection unit 1441 and output terminals of the diodes 316, 317, 416 and 417 of the second fault detection unit 1442. The fault detector 120 compares the voltage detection value generated from voltage of the eight diodes 118, 119, 216, 217, 316, 317, 416 and 417 with the predetermined threshold value so as to detect the fault and generates the comparison result.

Embodiment 15

Figure 16:
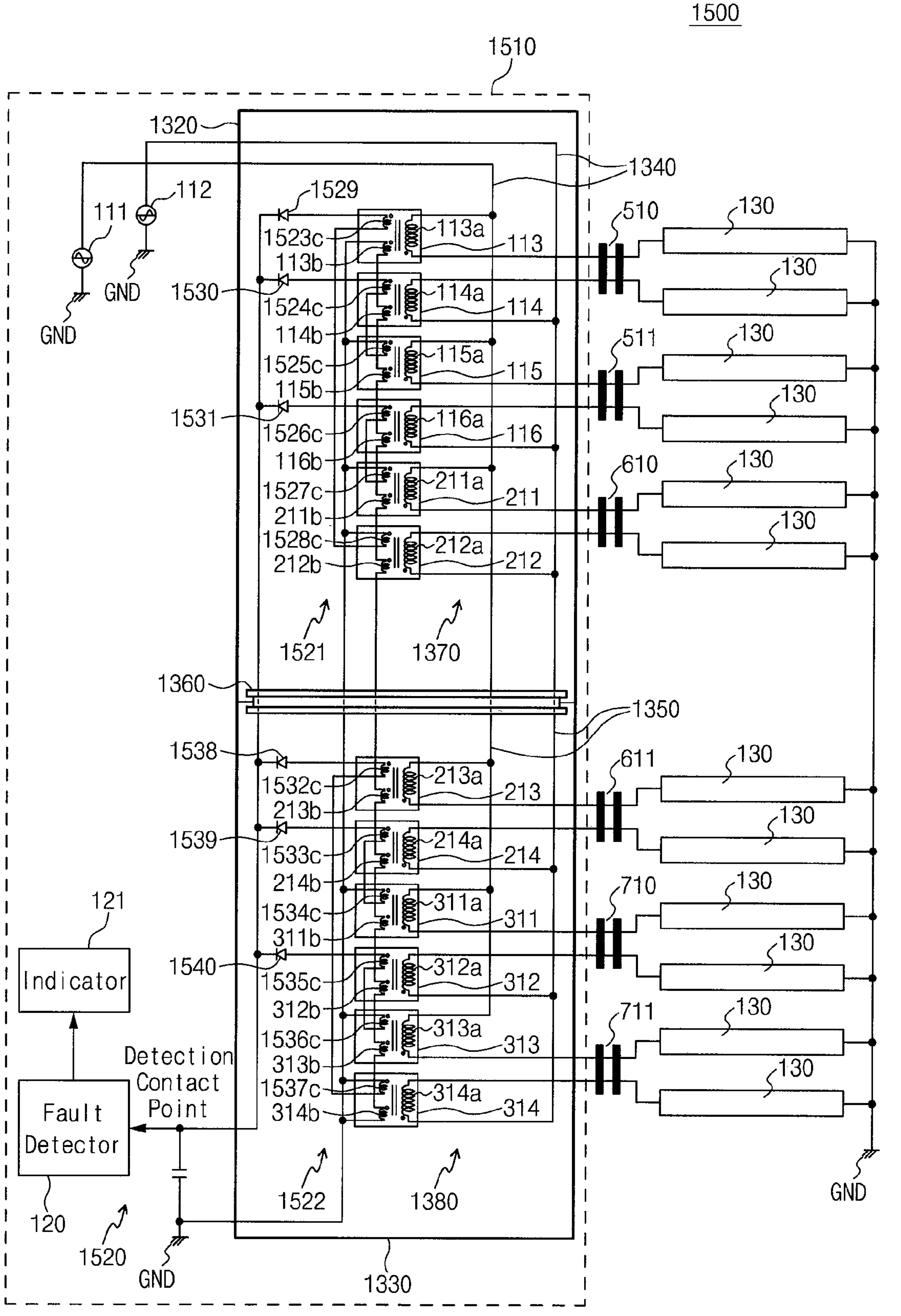
FIG. 16 is a circuit diagram showing an inverter circuit and a backlight assembly according to a fifteenth embodiment of the present invention.

Hereinafter, a fifteenth embodiment of the present invention will be described in detail with reference to accompanying drawings. FIG. 16 is a circuit diagram showing an inverter circuit and a backlight assembly according to the fifteenth embodiment of the present invention. The same reference numerals will be assigned to the elements identical to the elements shown in the eleventh and thirteenth embodiments, and detailed description thereof will be omitted in order to avoid redundancy.

As shown in FIG. 16, the backlight assembly 1500 according to the fifteenth embodiment of the present invention includes the inverter circuit 1510, six pairs of cold cathode fluorescent lamps (discharge tubes) 130, and six connectors 510, 511, 610, 611, 710 and 711.

The inverter circuit 1510 includes two inverters 111 and 112, a first substrate 1320, a second substrate 1330, a first power supply line 1340 mounted on the first substrate 1320, a second power supply line 1350 mounted on the second substrate 1330, a connector 1360 that interconnects the substrates, first group balance transformers 1370 mounted on the first substrate 1320, second group balance transforms 1380 mounted on the second substrate 1330, and a fault detection device 1520. That is, the inverter circuit 1510 according to the fifteenth embodiment of the present invention is identical to the inverter circuit 1310 according to the thirteenth embodiment of the present invention, except for the structure of the fault detection device 1520.

The fault detection device 1520 detects high voltage abnormal discharge in the inverter circuit 1510, such as corona discharge and arc discharge, which are generated when a defect occurs in an insulator provided between a high voltage section and the ground GND. The fault detection device 1520 detects the abnormal operation based on the voltage detection values generated from voltages of the first and second group balance transformers 1370 and 1380.

The fault detection device 1520 includes a first fault detection unit 1521, a second fault detection unit 1522, a fault detector 120 and an indicator 121. The first fault detection unit 1521 is electrically connected to the second fault detection unit 1522 through the connector 1360.

The first fault detection unit 1521 includes three pairs of third coils 1523_c_, 1524_c_, 1525_c_, 1526_c_, 1527_c_, and 1528_c_ and three diodes 1529, 1530 and 1531.

Among the third coils 1523_c_, 1524_c_, 1525_c_, 1526_c_, 1527_c_, and 1528_c_ of the first fault detection unit 1521, paired third coils, to which the AC voltage is induced from the primary coils connected to different connectors, are serially connected to each other so as to offset AC voltage generated from the paired third coils, and one end of the paired third coils is connected to the secondary coil serial loop. In addition, one end of the paired third coils can be directly connected to the ground GND, other than connected to the ground GND through the secondary coil serial loop.

That is, the paired third coils 1523_c_ and 1528_c_ are serially connected to each other so as to offset AC voltage generated from the paired third coils 1523_c_ and 1528_c_, in which the AC voltage is induced to the paired third coils 1523_c_ and 1528_c_ from the primary coils 113_a_ and 212_a_ connected to different connectors 510 and 610, respectively. In addition, one end of the paired third coils 1523_c_ and 1528_c_ is connected to the ground GND by way of the serial loop of the secondary coils 113_b_, 114_b_, 115_b_, 116_b_, 211_b_, 212_b_, 213_b_, 214_b_, 311_b_, 312_b_, 313_b_ and 314_b_.

In addition, the paired third coils 1524_c_ and 1525_c_ are serially connected to each other so as to offset AC voltage generated from the paired third coils 1524_c_ and 1525_c_, in which the AC voltage is induced to the paired third coils 1524_c_ and 1528_c_ from the primary coils 114_a_ and 115_a_ connected to different connectors 510 and 511, respectively. In addition, one end of the paired third coils 1524_c_ and 1525_c_ is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

Further, the paired third coils 1526*c* and 1527*c* are serially connected to each other so as to offset AC voltage generated from the paired third coils 1526*c* and 1527*c*, in which the AC voltage is induced to the paired third coils 1526*c* and 1527*c* from the primary coils 116*a* and 211*a* connected to different connectors 511 and 610, respectively. In addition, one end of the paired third coils 1526*c* and 1527*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

The second fault detection unit 1522 includes three pairs of third coils 1532*c*, 1533*c*, 1534*c*, 1535*c*, 1536*c*, and 1537*c* and three diodes 1538, 1539 and 1540.

Among the third coils 1532*c*, 1533*c*, 1534*c*, 1535*c*, 1536*c*, and 1537*c* of the second fault detection unit 1522, paired third coils, to which the AC voltage is induced from the primary coils connected to different connectors, are serially connected to each other so as to offset AC voltage generated from the paired third coils, and one end of the paired third coils is connected to the secondary coil serial loop. In addition, one end of the paired third coils can be directly connected to the ground GND, other than connected to the ground GND through the secondary coil serial loop.

That is, the paired third coils 1532*c* and 1537*c* are serially connected to each other so as to offset AC voltage generated from the paired third coils 1532*c* and 1537*c*, in which the AC voltage is induced to the paired third coils 1532*c* and 1537*c* from the primary coils 213*a* and 314*a* connected to different connectors 611 and 711, respectively. In addition, one end of the paired third coils 1532*c* and 1537*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

In addition, the paired third coils 1533*c* and 1534*c* are serially connected to each other so as to offset AC voltage generated from the paired third coils 1533*c* and 1534*c*, in which the AC voltage is induced to the paired third coils 1533*c* and 1534*c* from the primary coils 214*a* and 311*a* connected to different connectors 611 and 710, respectively. In addition, one end of the paired third coils 1533*c* and 1534*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

Further, the paired third coils 1535*c* and 1536*c* are serially connected to each other so as to offset AC voltage generated from the paired third coils 1535*c* and 1536*c*, in which the AC voltage is induced to the paired third coils 1535*c* and 1536*c* from the primary coils 312*a* and 313*a* connected to different connectors 710 and 711, respectively. In addition, one end of the paired third coils 1535*c* and 1536*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b* and 314*b*.

In this manner, the third coils of the first fault detection unit 1521 are connected to the third coils of the second fault detection unit 1522 by means of the connector 1360, and one end of the third coils of the first and second fault detection units 1521 and 1522 can be connected to the ground through the secondary coil serial loop.

Input terminals of the three diodes 1529, 1530 and 1531 of the first fault detection unit 1521 are connected to one end of the paired third coils so as to detect ripple voltage generated from the paired third coils and then produce the voltage detection value.

That is, the input terminal of the diode 1529 is connected to one end of the paired third coils 1523*c* and 1528*c*, to which the AC voltage is induced from the primary coils 113*a* and 212*a* connected to different connectors 510 and 610, in order to produce the voltage detection value by detecting the ripple voltage generated from the paired third coils 1523*c* and 1528*c*.

In addition, the input terminal of the diode 1530 is connected to one end of the paired third coils 1524*c* and 1525*c*, to which the AC voltage is induced from the primary coils 114*a* and 115*a* connected to different connectors 510 and 511, in order to produce the voltage detection value by detecting the ripple voltage generated from the paired third coils 1524*c* and 1525*c*.

Further, the input terminal of the diode 1531 is connected to one end of the paired third coils 1526*c* and 1527*c*, to which the AC voltage is induced from the primary coils 116*a* and 211*a* connected to different connectors 511 and 610, in order to produce the voltage detection value by detecting the ripple voltage generated from the paired third coils 1526*c* and 1527*c*.

Input terminals of the three diodes 1538, 1539 and 1540 of the second fault detection unit 1522 are connected to one end of the paired third coils so as to detect ripple voltage generated from the paired third coils and then produce the voltage detection value.

That is, the input terminal of the diode 1538 is connected to one end of the paired third coils 1532*c* and 1537*c*, to which the AC voltage is induced from the primary coils 213*a* and 314*a* connected to different connectors 611 and 711, in order to produce the voltage detection value by detecting the ripple voltage generated from the paired third coils 1532*c* and 1537*c*.

In addition, the input terminal of the diode 1539 is connected to one end of the paired third coils 1533*c* and 1534*c*, to which the AC voltage is induced from the primary coils 214*a* and 311*a* connected to different connectors 611 and 710, in order to produce the voltage detection value by detecting the ripple voltage generated from the paired third coils 1533*c* and 1534*c*.

Further, the input terminal of the diode 1540 is connected to one end of the paired third coils 1535*c* and 1536*c*, to which the AC voltage is induced from the primary coils 312*a* and 313*a* connected to different connectors 710 and 711, in order to produce the voltage detection value by detecting the ripple voltage generated from the paired third coils 1535*c* and 1536*c*.

The fault detector 120 is connected to output terminals of the diodes 1529, 1530 and 1531 of the first fault detection unit 1521 and output terminals of the diodes 1538, 1539 and 1540 of the second fault detection unit 1522. The fault detector 120 compares the voltage detection value generated from voltage of the six diodes 1529, 1530, 1531, 1538, 1539 and 1540 with the predetermined threshold value so as to detect the fault and generates the comparison result.

As described above, according to the fifteenth embodiment of the present invention, the connector for interconnecting substrates electrically connects the first and second power supply lines, the first and second substrates, the first and second group balance transforms and the first and second fault detection units. In addition, among the plural third coils of each fault detection unit, the paired third coils, to which the AC voltage is induced from the primary coils connected to different connectors, are serially connected to each other through the connector so as to offset the AC voltage generated from the paired third coils and one end of the paired third coils is connected to input terminals of the plural diodes. Thus, according to the thirteenth embodiment of the present invention, the backlight assembly can be fabricated in a large size without increasing the number of connector terminals interposed between substrates.

Further, according to the fifteenth embodiment of the present invention, even if the number of the cold cathode fluorescent lamps increases due to the large-size backlight assembly and the opening fault occurs in the connector that combines a pair of cold cathode fluorescent lamps, since the third coil, to which the AC voltage is induced from the primary coil connected between one connector and the output terminal of the inverter, is serially connected to another third coil, to which the AC voltage is induced from the primary coil connected to the other connector, AC voltages generated from the paired third coils are offset from each other in each substrate and the abnormal operation of the backlight assembly can be more precisely detected.

Embodiment 16

Figure 17:
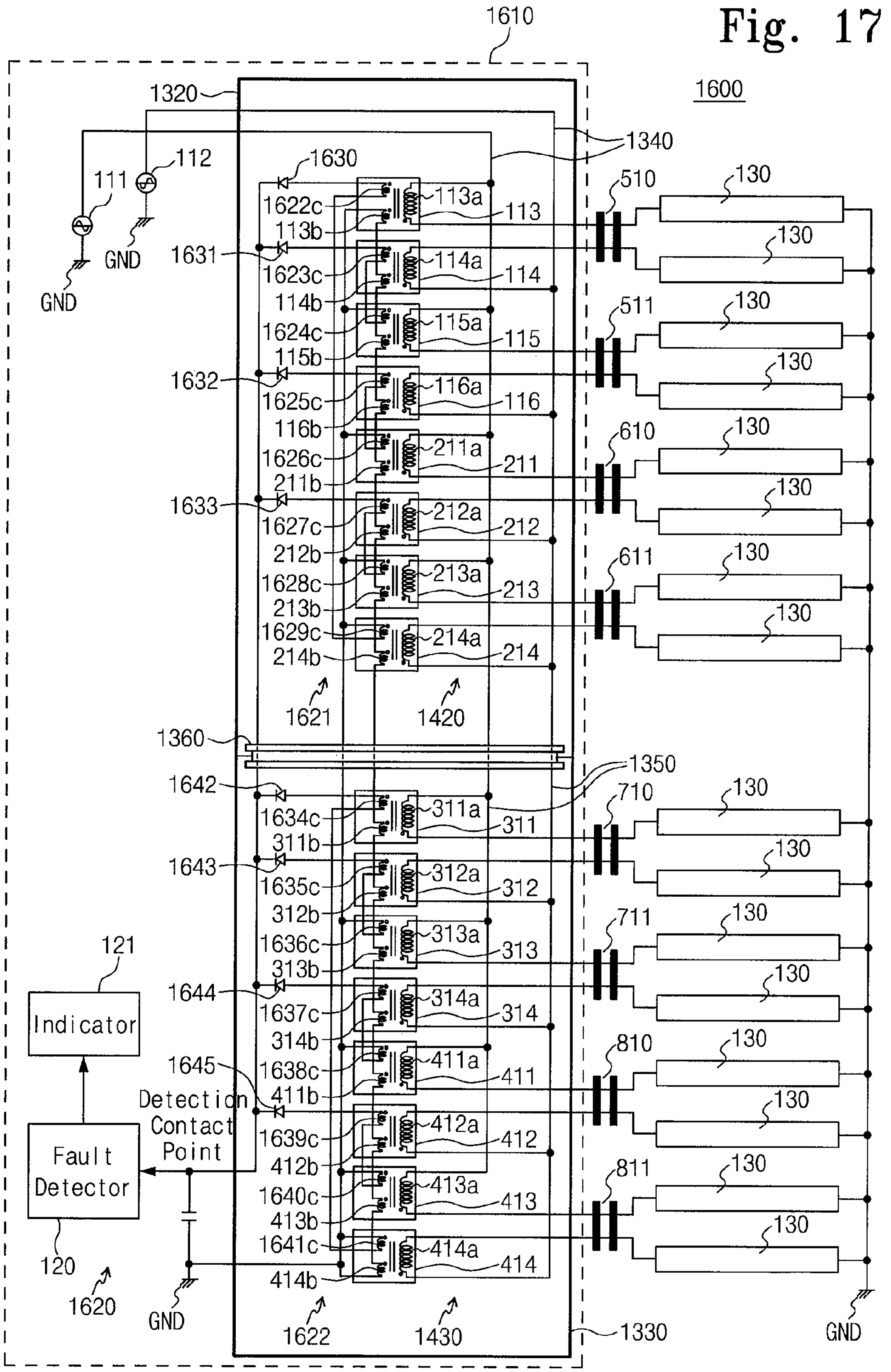
FIG. 17 is a circuit diagram showing an inverter circuit and a backlight assembly according to a sixteenth embodiment of the present invention.
Figure 18:
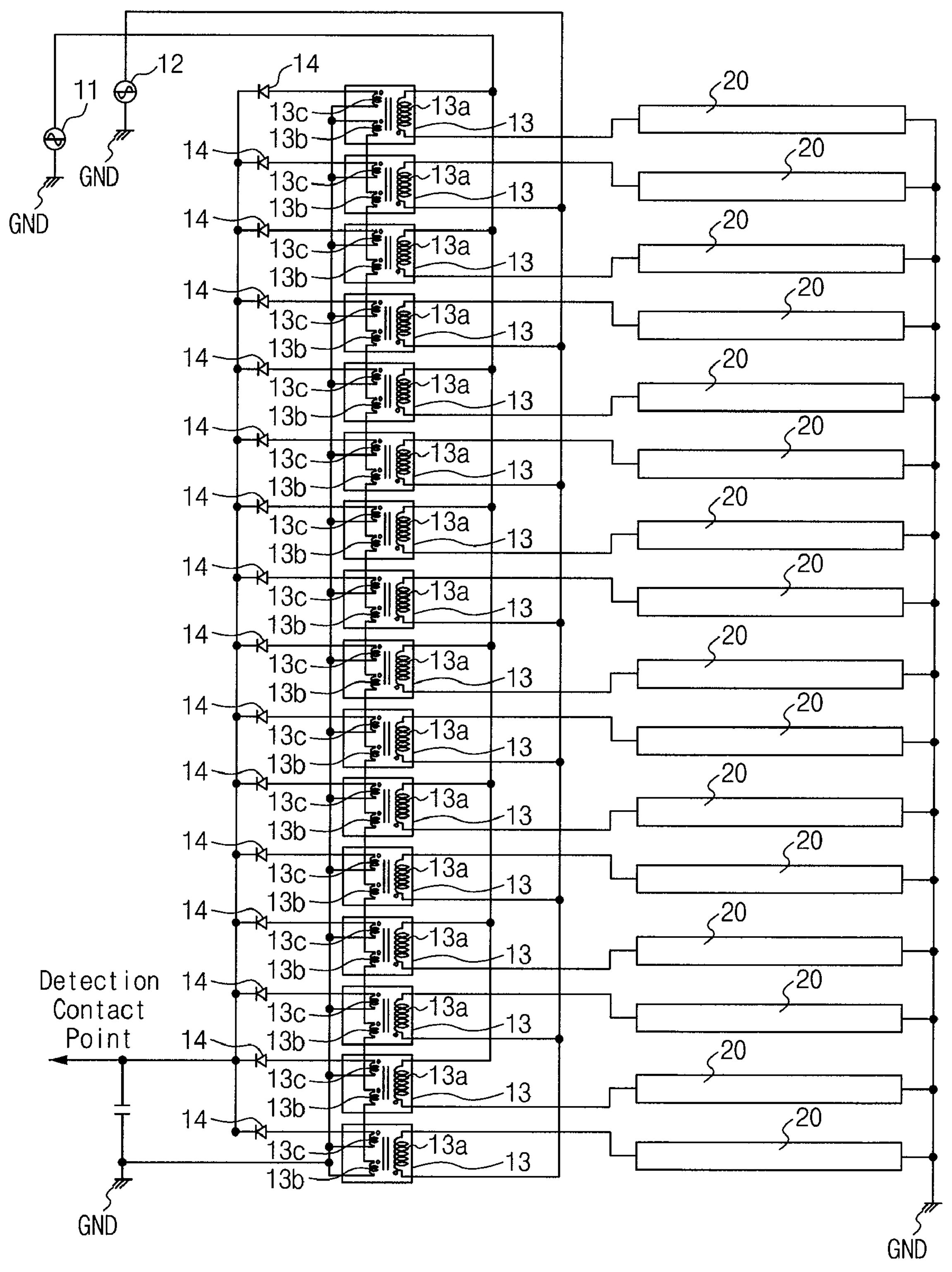
FIG. 18 is a circuit diagram showing a conventional inverter circuit.
Figure 19:
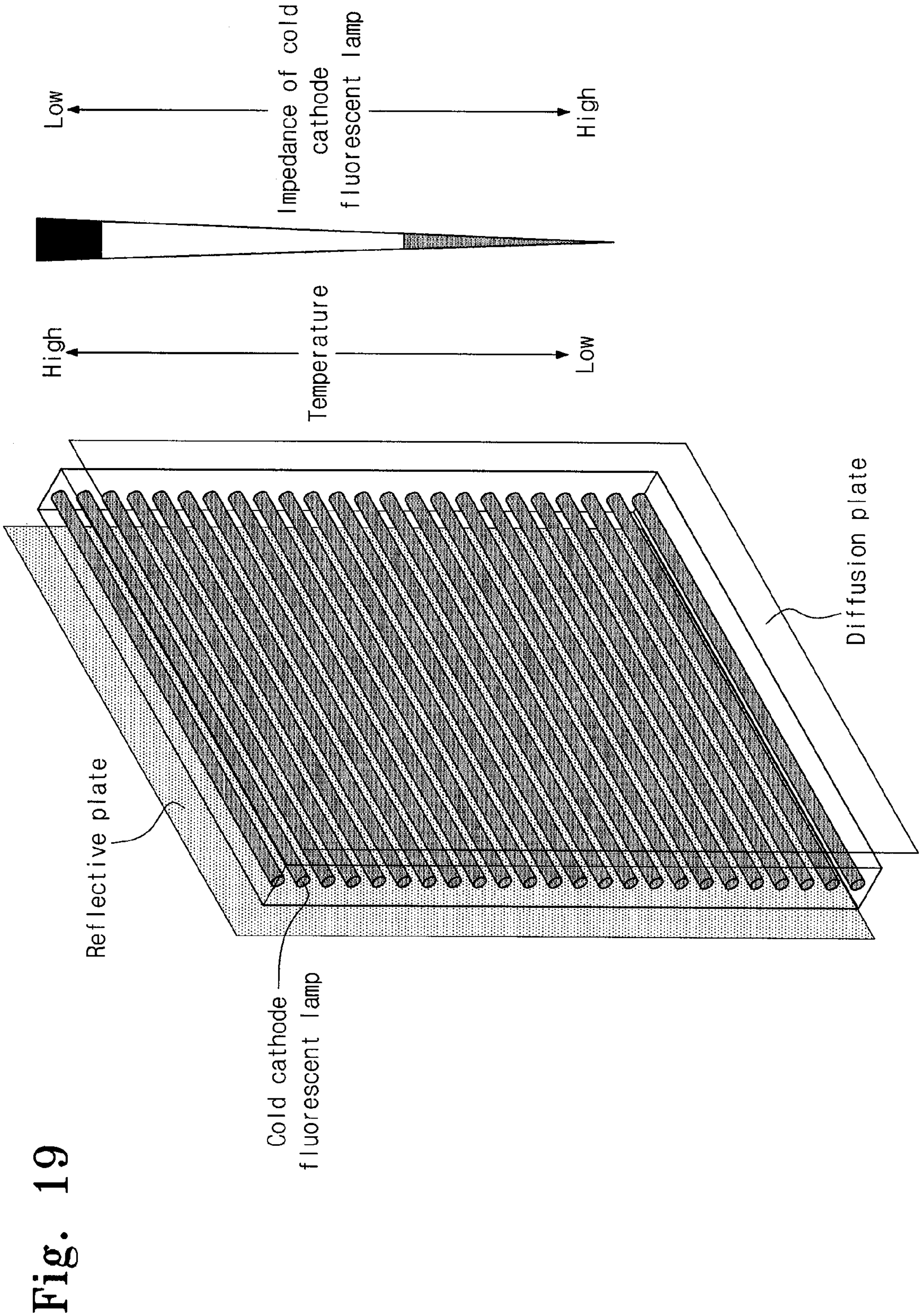
FIG. 19 is a perspective view showing impedance variation according to temperature variation in a backlight assembly.
Figure 20:
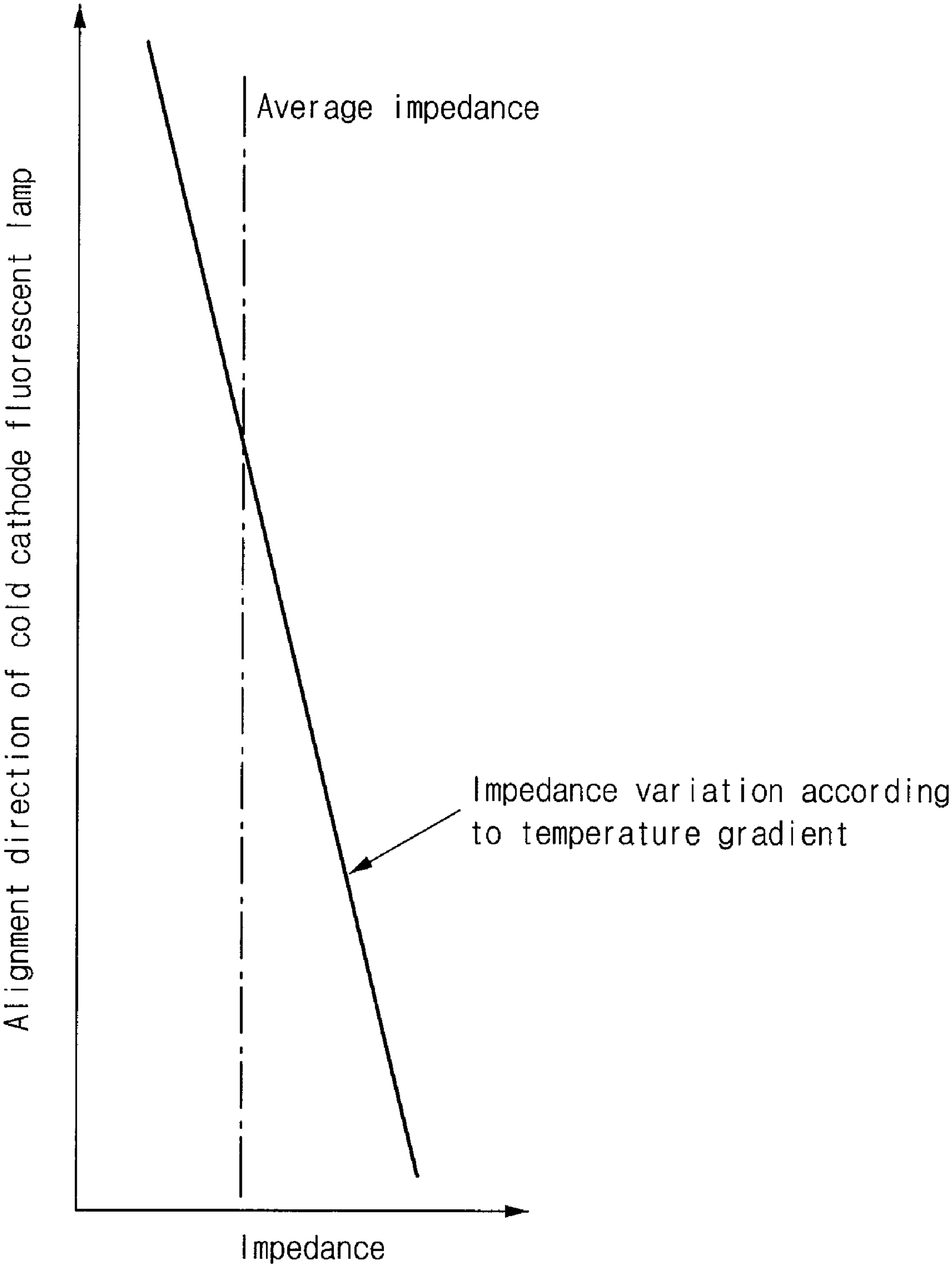
FIG. 20 is a graph showing impedance variation according to temperature variation in a backlight assembly.

Hereinafter, a sixteenth embodiment of the present invention will be described in detail with reference to accompanying drawings. FIG. 17 is a circuit diagram showing an inverter circuit and a backlight assembly according to the sixteenth embodiment of the present invention. The same reference numerals will be assigned to the elements identical to the elements shown in the twelfth and fourteenth embodiments, and detailed description thereof will be omitted in order to avoid redundancy.

As shown in FIG. 17, the backlight assembly 1600 according to the sixteenth embodiment of the present invention includes the inverter circuit 1610, eight pairs of cold cathode fluorescent lamps (discharge tubes) 130, and eight connectors 510, 511, 610, 611, 710, 711, 810 and 811.

The inverter circuit 1610 includes two inverters 111 and 112, a first substrate 1320, a second substrate 1330, a first power supply line 1340 mounted on the first substrate 1320, a second power supply line 1350 mounted on the second substrate 1330, a connector 1360 that interconnects the substrates, first group balance transformers 1420 mounted on the first substrate 1320, second group balance transforms 1430 mounted on the second substrate 1330, and a fault detection device 1620. That is, the inverter circuit 1610 according to the sixteenth embodiment of the present invention is identical to the inverter circuit 1410 according to the fourteenth embodiment of the present invention, except for the structure of the fault detection device 1620.

The fault detection device 1620 detects high voltage abnormal discharge in the inverter circuit 1610, such as corona discharge and arc discharge, which are generated when a defect occurs in an insulator provided between a high voltage section and the ground GND. The fault detection device 1620 detects the abnormal operation based on the voltage detection values generated from voltages of the first and second group balance transformers 1420 and 1430.

The fault detection device 1620 includes a first fault detection unit 1621, a second fault detection unit 1622, a fault detector 120 and an indicator 121. The first fault detection unit 1621 is electrically connected to the second fault detection unit 1622 through the connector 1360.

The first fault detection unit 1621 includes four pairs of third coils 1622*c*, 1623*c*, 1624*c*, 1625*c*, 1626*c*, 1627*c*, 1628*c* and 1629*c* and four diodes 1630, 1631, 1632 and 1633.

Among the third coils 1622*c*, 1623*c*, 1624*c*, 1625*c*, 1626*c*, 1627*c*, 1628*c* and 1629*c* of the first fault detection unit 1621, paired third coils, to which the AC voltage is induced from the primary coils connected to different connectors, are serially connected to each other so as to offset AC voltage generated from the paired third coils, and one end of the paired third coils is connected to the secondary coil serial loop. In addition, one end of the paired third coils can be directly connected to the ground GND, other than connected to the ground GND through the secondary coil serial loop.

That is, the paired third coils 1622*c* and 1629*c* are serially connected to each other so as to offset AC voltage generated from the paired third coils 1622*c* and 1629*c*, in which the AC voltage is induced to the paired third coils 1622*c* and 1629*c* from the primary coils 113*a* and 214*a* connected to different connectors 510 and 611, respectively. In addition, one end of the paired third coils 1622*c* and 1629*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

In addition, the paired third coils 1623*c* and 1624*c* are serially connected to each other so as to offset AC voltage generated from the paired third coils 1623*c* and 1624*c*, in which the AC voltage is induced to the paired third coils 1623*c* and 1624*c* from the primary coils 114*a* and 115*a* connected to different connectors 510 and 511, respectively. In addition, one end of the paired third coils 1623*c* and 1624*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

Further, the paired third coils 1625*c* and 1626*c* are serially connected to each other so as to offset AC voltage generated from the paired third coils 1625*c* and 1626*c*, in which the AC voltage is induced to the paired third coils 1625*c* and 1626*c* from the primary coils 116*a* and 211*a* connected to different connectors 511 and 610, respectively. In addition, one end of the paired third coils 1625*c* and 1626*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

Furthermore, the paired third coils 1627*c* and 1628*c* are serially connected to each other so as to offset AC voltage generated from the paired third coils 1627*c* and 1628*c*, in which the AC voltage is induced to the paired third coils 1627*c* and 1628*c* from the primary coils 212*a* and 213*a* connected to different connectors 610 and 611, respectively. In addition, one end of the paired third coils 1627*c* and 1628*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

The second fault detection unit 1622 includes four pairs of third coils 1634*c*, 1635*c*, 1636*c*, 1637*c*, 1638*c*, 1639*c*, 1640*c* and 1641*c* and four diodes 1642, 1643, 1644 and 1645.

Among the third coils 1634*c*, 1635*c*, 1636*c*, 1637*c*, 1638*c*, 1639*c*, 1640*c* and 1641*c* of the second fault detection unit 1622, paired third coils, to which the AC voltage is induced from the primary coils connected to different connectors, are serially connected to each other so as to offset AC voltage generated from the paired third coils, and one end of the paired third coils is connected to the secondary coil serial loop. In addition, one end of the paired third coils can be directly connected to the ground GND, other than connected to the ground GND through the secondary coil serial loop.

That is, the paired third coils 1634*c* and 1641*c* are serially connected to each other so as to offset AC voltage generated from the paired third coils 1634*c* and 1641*c*, in which the AC voltage is induced to the paired third coils 1634*c* and 1641*c* from the primary coils 311*a* and 414*a* connected to different connectors 710 and 811, respectively. In addition, one end of the paired third coils 1634*c* and 1641*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

In addition, the paired third coils 1635*c* and 1636*c* are serially connected to each other so as to offset AC voltage generated from the paired third coils 1635*c* and 1636*c*, in which the AC voltage is induced to the paired third coils 1635*c* and 1636*c* from the primary coils 312*a* and 313*a* connected to different connectors 710 and 711, respectively. In addition, one end of the paired third coils 1635*c* and 1636*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

Further, the paired third coils 1637*c* and 1638*c* are serially connected to each other so as to offset AC voltage generated from the paired third coils 1637*c* and 1638*c*, in which the AC voltage is induced to the paired third coils 1637*c* and 1638*c* from the primary coils 314*a* and 411*a* connected to different connectors 711 and 810, respectively. In addition, one end of the paired third coils 1637*c* and 1638*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

Furthermore, the paired third coils 1639*c* and 1640*c* are serially connected to each other so as to offset AC voltage generated from the paired third coils 1639*c* and 1640*c*, in which the AC voltage is induced to the paired third coils 1639*c* and 1640*c* from the primary coils 412*a* and 413*a* connected to different connectors 810 and 811, respectively. In addition, one end of the paired third coils 1639*c* and 1640*c* is connected to the ground GND by way of the serial loop of the secondary coils 113*b*, 114*b*, 115*b*, 116*b*, 211*b*, 212*b*, 213*b*, 214*b*, 311*b*, 312*b*, 313*b*, 314*b*, 411*b*, 412*b*, 413*b* and 414*b*.

In this manner, the third coils of the first fault detection unit 1621 are connected to the third coils of the second fault detection unit 1622 by means of the connector 1360, and one end of the third coils of the first and second fault detection units 1621 and 1622 can be connected to the ground through the secondary coil serial loop.

Input terminals of the four diodes 1630, 1631, 1632 and 1633 of the first fault detection unit 1621 are connected to one end of the paired third coils so as to detect ripple voltage generated from the paired third coils and then produce the voltage detection value.

That is, the input terminal of the diode 1630 is connected to one end of the paired third coils 1622*c* and 1629*c*, to which the AC voltage is induced from the primary coils 113*a* and 214*a* connected to different connectors 510 and 611, in order to produce the voltage detection value by detecting the ripple voltage generated from the paired third coils 1622*c* and 1629*c*.

In addition, the input terminal of the diode 1631 is connected to one end of the paired third coils 1623*c* and 1624*c*, to which the AC voltage is induced from the primary coils 114*a* and 115*a* connected to different connectors 510 and 511, in order to produce the voltage detection value by detecting the ripple voltage generated from the paired third coils 1623*c* and 1624*c*.

Further, the input terminal of the diode 1632 is connected to one end of the paired third coils 1625*c* and 1626*c*, to which the AC voltage is induced from the primary coils 116*a* and 211*a* connected to different connectors 511 and 610, in order to produce the voltage detection value by detecting the ripple voltage generated from the paired third coils 1625*c* and 1626*c*.

Furthermore, the input terminal of the diode 1633 is connected to one end of the paired third coils 1627*c* and 1628*c*, to which the AC voltage is induced from the primary coils 212*a* and 213*a* connected to different connectors 610 and 611, in order to produce the voltage detection value by detecting the ripple voltage generated from the paired third coils 1627*c* and 1628*c*.

Input terminals of the four diodes 1642, 1643, 1644 and 1645 of the second fault detection unit 1622 are connected to one end of the paired third coils so as to detect ripple voltage generated from the paired third coils and then produce the voltage detection value.

That is, the input terminal of the diode 1642 is connected to one end of the paired third coils 1634*c* and 1641*c*, to which the AC voltage is induced from the primary coils 311*a* and 414*a* connected to different connectors 710 and 811, in order to produce the voltage detection value by detecting the ripple voltage generated from the paired third coils 1634*c* and 1641*c*.

In addition, the input terminal of the diode 1643 is connected to one end of the paired third coils 1635*c* and 1636*c*, to which the AC voltage is induced from the primary coils 312*a* and 313*a* connected to different connectors 710 and 711, in order to produce the voltage detection value by detecting the ripple voltage generated from the paired third coils 1635*c* and 1636*c*.

Further, the input terminal of the diode 1644 is connected to one end of the paired third coils 1637*c* and 1638*c*, to which the AC voltage is induced from the primary coils 314*a* and 411*a* connected to different connectors 711 and 810, in order to produce the voltage detection value by detecting the ripple voltage generated from the paired third coils 1637*c* and 1638*c*.

Furthermore, the input terminal of the diode 1645 is connected to one end of the paired third coils 1639*c* and 1640*c*, to which the AC voltage is induced from the primary coils 412*a* and 413*a* connected to different connectors 810 and 811, in order to produce the voltage detection value by detecting the ripple voltage generated from the paired third coils 1639*c* and 1640*c*.

The fault detector 120 is connected to output terminals of the diodes 1630, 1631, 1632 and 1633 of the first fault detection unit 1621 and output terminals of the diodes 1642, 1643, 1644 and 1645 of the second fault detection unit 1622. The fault detector 120 compares the voltage detection value generated from voltage of the eight diodes 1630, 1631, 1632, 1633, 1642, 1643, 1644 and 1645 with the predetermined threshold value so as to detect the fault and generates the comparison result.

Although the first to sixteenth embodiments of the present invention have been described in relation to the backlight assembly having four to sixteen cold cathode fluorescent lamps, which are provided as pairs, the present invention is also applicable for the backlight assembly having eighteen cathode fluorescent lamps or more, which are provided as pairs.

According to the inverter circuit and the backlight assembly described above, the paired third coils, which are adjacent to each other, are serially connected to each other so as to offset the AC voltage generated from the paired third coils, and one end of the paired third coils is connected to input terminals of the plural diodes. In addition, the fault detector compares the voltage detection value generated from voltages of the plural diodes with the predetermined threshold value to detect the fault and transmits the comparison result to the indicator. Further, even if the voltage rises in the backlight assembly due to impedance variation caused by the temperature gradient, the threshold value used to detect the abnormal operation of the backlight assembly can be appropriately set and the abnormal operation can be precisely detected.

That is, when impedance variation occurs due to the temperature gradient in the plural cold cathode fluorescent lamps, each paired third coils may generate voltages different from each other due to the difference in impedance, but AC voltages generated from the paired third coils, which are adjacent to each other, are offset from each other, so the threshold value can be set based on the differential voltage between the paired third coils. Thus, as compared with the conventional art, the abnormal operation of the backlight assembly can be precisely detected even if the threshold value is set to a low level. Therefore, since the threshold value used to detect the abnormal operation of the backlight assembly can be appropriately set, voltage variation can be precisely detected even if the voltage is slightly increased due to arc discharge caused by the opening fault and is below the threshold value under a condition of the conventional art. Thus, the abnormal operation of the backlight assembly can be precisely detected.

In addition, since only one diode is required for the paired third coils, which are adjacent to each other, the number of diodes can be reduced as compared with the prior art in which the diode is provided for each third coil. Accordingly, the circuit structure can be simplified and the manufacturing cost can be reduced.

Further, when the plural cold cathode fluorescent lamps are connected to the balance transformers, two cold cathode fluorescent lamps are combined by means of the connector, so workability can be improved when installing or exchanging the cold cathode fluorescent lamps and the manufacturing cost can be reduced.

In addition, according to the backlight assembly described above, the paired third coils, to which the AC voltage is induced from the primary coils connected to different connectors, are serially connected to each other so as to offset the AC voltage generated from the paired third coils, and one end of the paired third coils is connected to input terminals of the plural diodes. In addition, the fault detector compares the voltage detection value generated from voltage of the plural diodes with the predetermined threshold value to detect the fault and transmits the comparison result to the indicator. Accordingly, even if the opening fault occurs in the pair of cold cathode fluorescent lamps in the backlight assembly, the threshold value used to detect the abnormal operation of the backlight assembly can be appropriately set and the abnormal operation can be precisely detected.

In other words, when the opening fault occurs in the connector that combines a pair of cold cathode fluorescent lamps, since the third coil, to which the AC voltage is induced from the primary coil connected between one connector and the output terminal of the inverter, is serially connected to another third coil, to which the AC voltage is induced from the primary coil connected to the other connector, so as to offset the AC voltage generated from the paired third coils, the abnormal operation of the backlight assembly can be precisely detected.

In addition, since only one diode is required for the paired third coils, the number of diodes can be reduced as compared with the prior art in which the diode is provided for each third coil. Accordingly, the circuit structure can be simplified and the manufacturing cost can be reduced.

According to the backlight assembly having the above structure, the connector for interconnecting substrates electrically connects the first and second power supply lines, the first and second substrates, the first and second group balance transforms and the first and second fault detection units. In addition, among the plural third coils of each fault detection unit, adjacent third coils, which are aligned as a pair, are serially connected to each other through the connector so as to offset the AC voltage generated from the paired third coils and one end of the paired third coils is connected to input terminals of the plural diodes. Thus, the backlight assembly can be fabricated in a large size without increasing the number of connector terminals interposed between substrates.

Further, even if the number of the cold cathode fluorescent lamps increases due to the large-size backlight assembly, since the adjacent third coils, which are aligned as a pair, are serially connected to each other so as to offset the AC voltage generated from the paired third coils, the abnormal operation of the backlight assembly can be more precisely detected.

In addition, since only one diode is required for the paired third coils, the number of diodes can be reduced as compared with the prior art in which the diode is provided for each third coil. Accordingly, the circuit structure can be simplified and the manufacturing cost can be reduced.

Further, according to the backlight assembly described above, the connector for interconnecting substrates electrically connects the first and second power supply lines, the first and second substrates, the first and second group balance transforms and the first and second fault detection units. In addition, among the plural third coils of the first and second fault detection units, the paired third coils, to which the AC voltage is induced from the primary coils connected to different connectors, are serially connected to each other through the connector so as to offset the AC voltage generated from the paired third coils and one end of the paired third coils is connected to input terminals of the plural diodes. Thus, the backlight assembly can be fabricated in a large size without increasing the number of connector terminals interposed between substrates.

In addition, even if the number of the cold cathode fluorescent lamps increases due to the large-size backlight assembly and the opening fault occurs in the connector that combines a pair of cold cathode fluorescent lamps, since the third coil, to which the AC voltage is induced from the primary coil connected between one connector and the output terminal of the inverter, is serially connected to another third coil, to which the AC voltage is induced from the primary coil connected to the other connector, in each substrate so as to offset the AC voltage generated from the paired third coils, the abnormal operation of the backlight assembly can be more precisely detected.

Further, since only one diode is required for the paired third coils, the number of diodes can be reduced as compared with the prior art in which the diode is provided for each third coil. Accordingly, the circuit structure can be simplified and the manufacturing cost can be reduced.

According to the present invention, the abnormal operation of the backlight assembly can be precisely detected, even if the voltage rises in the backlight assembly due to impedance variation caused by the temperature gradient.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A backlight assembly comprising:

plural pairs of discharge tubes;

a pair of inverters converting DC voltages from an exterior into AC voltages to transmit the AC voltages to the plural pairs of discharge tubes;

plural pairs of balance transformers, each pair being connected to an output terminal of a corresponding inverter of the inverters; and a fault detection device that detects a fault based on values of current applied to the balance transformers, wherein each pair of the balance transformers comprises:

a pair of primary coils each being connected between the output terminal of the corresponding inverter and a corresponding discharge tube;

a pair of secondary coils aligned corresponding to the primary coils and connected to each other in series; and a pair of third coils aligned corresponding to the primary coils and connected to each other in series, a first end of the connected third coils being connected to ground, and a second end of the connected third coils being connected to the fault detection device.

2. The backlight assembly as claimed in claim 1, wherein the fault detection device comprises:

a plurality of diodes having input terminals each connected to the second end of the connected third coils; and a fault detector connected to output terminals of the diodes to generate a comparison result.

3. The backlight assembly as claimed in claim 2, wherein the fault detector comprises:

a ripple DC voltage converter connected to the output terminals of the diodes to generate a voltage detection value;

a reference voltage generator generating a reference voltage; and a comparator comparing the voltage detection value with the reference voltage to generate the comparison result.

4. The backlight assembly as claimed in claim 2, wherein the fault detection device further comprises an indicator displaying the comparison result from the fault detector.

5. The backlight assembly as claimed in claim 1, further comprising a plurality of connectors each of which electrically connects the paired discharge tubes to the corresponding inverter through the primary coils of the balance transformers.

6. A backlight assembly comprising:

plural pairs of discharge tubes;

a pair of inverters converting DC voltages from an exterior into AC voltages to transmit the AC voltages to the plural pairs of discharge tubes;

plural pairs of balance transformers, each pair being connected to an output terminal of a corresponding inverter of the inverters; and a fault detection device that detects a fault based on values of current applied to the balance transformers, wherein each pair of the balance transformers comprises:

a pair of primary coils, each being connected between the output terminal of the corresponding inverter and a corresponding discharge tube;

a pair of secondary coils aligned corresponding to the primary coils and connected to each other in series; and a pair of third coils aligned corresponding to the primary coils, and wherein two third coils belonging to each pair of balance transformers are respectively connected to two third coils belonging to others in series, a first end of the connected third coils is connected to ground, and a second end of the connected third coils is connected to the fault detection device.

7. The backlight assembly as claimed in claim 6, wherein the fault detection device comprises:

a plurality of diodes having input terminals connected to second ends of the connected third coils; and a fault detector connected to output terminals of the diodes to generate a comparison result.

8. The backlight assembly as claimed in claim 7, wherein the fault detector comprises:

a ripple DC voltage converter connected to the output terminals of the diodes to generate a voltage detection value;

a reference voltage generator generating a reference voltage; and a comparator comparing the voltage detection value with the reference voltage to generate the comparison result.

9. The backlight assembly as claimed in claim 7, wherein the fault detection device further comprises an indicator displaying the comparison result from the fault detector.

10. The backlight assembly as claimed in claim 6, further comprising a plurality of connectors each of which electrically connects the paired discharge tubes to the corresponding inverter through the primary coils of the balance transformers.

11. A backlight assembly comprising:

plural pairs of discharge tubes;

a pair of inverters converting DC voltages from an exterior into AC voltages to transmit the AC voltages to the plural pairs of discharge tubes;

plural pairs of balance transformers grouped into a first group and a second group, each pair being connected to an output terminal of a corresponding inverter of the inverters;

first and second substrates, on which the first and the second group balance transformers respectively mounted; and a fault detection device that detects a fault based on values of current applied to the first and the second group balance transformers, wherein each pair of the first and the second group balance transformers comprises:

a pair of primary coils each being connected between the output terminal of the corresponding inverter and a corresponding discharge tube;

a pair of secondary coils aligned corresponding to the primary coils and connected to each other in series; and a pair of third coils aligned corresponding to the primary coils and connected to each other in series, a first end of the connected third coils being connected to ground, and a second end of the connected third coils being connected to the fault detection device.

12. The backlight assembly as claimed in claim 11, wherein the fault detection device comprises:

a plurality of diodes having input terminals, each connected to the second end of the connected third coils; and a fault detector connected to output terminals of the diodes to generate a comparison result.

13. The backlight assembly as claimed in claim 12, wherein the fault detector comprises:

a ripple DC voltage converter connected to the output terminals of the diodes to generate a voltage detection value;

a reference voltage generator generating a reference voltage; and a comparator comparing the voltage detection value with the reference voltage to generate the comparison result.

14. The backlight assembly as claimed in claim 12, wherein the fault detection device further comprises an indicator displaying the comparison result from the fault detector.

15. The backlight assembly as claimed in claim 11, further comprising a plurality of connectors each of which electrically connects the paired discharge tubes to the corresponding inverter through the primary coils of the balance transformers.

16. A backlight assembly comprising:

plural pairs of discharge tubes;

a pair of inverters converting DC voltages from an exterior into AC voltages to transmit the AC voltages to the plural pairs of discharge tubes;

plural pairs of balance transformers grouped into a first group and a second group, each pair being connected to an output terminal of a corresponding inverter of the inverters;

first and second substrates, on which the first and the second group balance transformers respectively mounted; and a fault detection device that detects a fault based on values of current applied to the first and the second group balance transformers, wherein each pair of the first and the second group balance transformers comprise:

a pair of primary coils, each being connected between the output terminal of the corresponding inverter and a corresponding discharge tube;

a pair of secondary coils aligned corresponding to the primary coils and connected to each other in series; and a pair of third coils aligned corresponding to the primary coils, and wherein two third coils belonging to each pair of balance transformers are respectively connected to two third coils belonging to others in series, a first end of the connected third coils is connected to ground, and a second end of the connected third coils is connected to the fault detection device.

17. The backlight assembly as claimed in claim 16, wherein the fault detection device comprises:

a plurality of diodes having input terminals connected to second ends of the connected third coils; and a fault detector connected to output terminals of the diodes to generate a comparison result.

18. The backlight assembly as claimed in claim 17, wherein the fault detector comprises:

a ripple DC voltage converter connected to the output terminals of the diodes to generate a voltage detection value;

a reference voltage generator generating a reference voltage; and a comparator comparing the voltage detection value with the reference voltage to generate the comparison result.

19. The backlight assembly as claimed in claim 17, wherein the fault detection device further comprises an indicator displaying the comparison result from the fault detector.

20. The backlight assembly as claimed in claim 16, further comprising a plurality of connectors each of which electrically connects the paired discharge tubes to the corresponding inverter through the primary coils of the balance transformers.

* * * * *